United States Patent
Nienaber

(10) Patent No.: US 9,264,268 B2
(45) Date of Patent: Feb. 16, 2016

(54) PERIODIC TIME SEGMENT SEQUENCE BASED DECIMATION

(71) Applicant: Innoventure L.P., Colorado Springs, CO (US)

(72) Inventor: David K Nienaber, Colorado Springs, CO (US)

(73) Assignee: Innoventure L.P., Colorado Springs, CO (US)

( * ) Notice: Subject to any disclaimer, the term of this patent is extended or adjusted under 35 U.S.C. 154(b) by 114 days.

(21) Appl. No.: 14/051,082

(22) Filed: Oct. 10, 2013

(65) Prior Publication Data

US 2014/0105326 A1    Apr. 17, 2014

Related U.S. Application Data

(63) Continuation-in-part of application No. 13/651,259, filed on Oct. 12, 2012, and a continuation-in-part of application No. 13/827,966, filed on Mar. 14, 2013, now Pat. No. 8,817,854, and a continuation-in-part of application No. 13/830,092, filed on Mar. 14, 2013, now Pat. No. 9,100,181.

(60) Provisional application No. 61/808,206, filed on May 24, 2013.

(51) Int. Cl.
| | |
|---|---|
| *H04B 1/38* | (2015.01) |
| *H04L 5/16* | (2006.01) |
| *H04L 25/40* | (2006.01) |
| *H04B 1/00* | (2006.01) |
| *H03H 15/00* | (2006.01) |
| *H03H 19/00* | (2006.01) |

(52) U.S. Cl.
CPC .............. *H04L 25/40* (2013.01); *H03H 15/00* (2013.01); *H03H 19/006* (2013.01); *H04B 1/0003* (2013.01)

(58) Field of Classification Search
CPC ......................................................... H04B 1/38
See application file for complete search history.

(56) References Cited

U.S. PATENT DOCUMENTS

| | | | |
|---|---|---|---|
| 5,142,553 | A | 8/1992 | Rosenkranz |
| 5,621,345 | A | 4/1997 | Lee et al. |

(Continued)

FOREIGN PATENT DOCUMENTS

| | | |
|---|---|---|
| EP | 0208817 B1 | 12/1990 |
| EP | 0757446 A2 | 2/1997 |
| WO | 2012/087106 A1 | 6/2012 |

OTHER PUBLICATIONS

Amir Ghaffari, Eric A.M. Klumperink, Michiel C.M. Soer, and Bram Nauta; Tunable High-Q N-Path Band-Pass Filters: Modeling and Verification; IEEE Journal of Solid-State Circuits; vol. 46, No. 5; May 2011; pp. 998-1010.

(Continued)

*Primary Examiner* — Tanmay Shah

(57) ABSTRACT

Filtered signal values are extracted from an input signal. A periodic time segment sequence having a plurality of ordered time segments is defined. Multiple sets of signal values are acquired from the input signal. Each signal value of a set is acquired during a same ordered time segment. Each set is acquired over multiple repetitions of the periodic time segment sequence. Each set is acquired during a different ordered time segment than each other set. For each set of at least two sets, signal values from the set are combined to obtain a separate filtered signal value for each set.

74 Claims, 7 Drawing Sheets

(56) References Cited

U.S. PATENT DOCUMENTS

| | | |
|---|---|---|
| 5,784,414 A | 7/1998 | Bruekers |
| 5,841,811 A | 11/1998 | Song |
| 5,923,030 A | 7/1999 | Assard et al. |
| 5,937,013 A | 8/1999 | Lam et al. |
| 5,953,370 A | 9/1999 | Durrant et al. |
| 6,181,740 B1 | 1/2001 | Yasuda |
| 6,337,888 B1 | 1/2002 | Huang et al. |
| 6,341,216 B1 | 1/2002 | Itoh |
| 6,397,048 B1 | 5/2002 | Toda |
| 6,650,264 B1 | 11/2003 | Chan et al. |
| 6,839,389 B2 | 1/2005 | Mehrnia et al. |
| 7,414,424 B2 | 8/2008 | Chao et al. |
| 7,514,993 B2 | 4/2009 | Konchitsky |
| 7,714,760 B2 | 5/2010 | Petrovic |
| 7,812,750 B2 | 10/2010 | Lakdawala et al. |
| 8,442,097 B2 | 5/2013 | Fenton et al. |
| 2003/0083033 A1 | 5/2003 | Staszewski et al. |
| 2003/0093278 A1 | 5/2003 | Malah |
| 2005/0130610 A1 | 6/2005 | Scheck et al. |
| 2009/0028269 A1 | 1/2009 | Pinkney |
| 2009/0279650 A1 | 11/2009 | Qian |
| 2009/0322578 A1 | 12/2009 | Petrovic |
| 2010/0178894 A1 | 7/2010 | Romain et al. |
| 2011/0207459 A1* | 8/2011 | Ramasamy et al. .......... 455/436 |
| 2012/0026039 A1 | 2/2012 | Ganeshan |
| 2012/0236976 A1 | 9/2012 | Smith |
| 2012/0249888 A1 | 10/2012 | Naik et al. |
| 2012/0257829 A1 | 10/2012 | Fam et al. |

OTHER PUBLICATIONS

David Gubbins, Bumha Lee, Pavan Kumar Hanumolu, Un-Ku Moon; Continuous-Time Input Pipeline ADCs; IEEE Journal of Solid State Circuits; Aug. 2010; 1456-1468; vol. 45, No. 8; U.S.

Taehwan Oh, Nima Maghhari, David Gubbins, Un-Ku Moon; IEEE Transactions on Circuits and Systems—II Express Briefs; Jul. 2011; 417-421; vol. 58, No. 7; U.S.

Mark Ingels, Vito Giannini, Jonathan Borremans, Gunjan Mandal, Bjorn Debaillie, Peter Van Wesemael, Tomohiro Sang, Takaya Yamamoto, Dries Hauspie, Joris Van Driessche, Jan Craninckx; A 5mm 2 40nm LP CMOS 0.1-to-3GHz Multistandard Transceiver; 2010 IEEE International Solid-State Circuits Conference Digest of Technical Papers; Feb. 10, 2010; pp. 458-460.

Asad A. Abidi; The path to the Software-Defined Radio Receiver; 2010 IEEE Journal of Solid-State Circuits; vol. 42, No. 5; May, 2007; pp. 954-966.

Amir Ghaffari, Eric A.M. Klumperink, Michiel C.M. Soer, Bram Nauta, University of Twente, CTIT Institute, IC Design Group, Enshede, The Netherlands; Tunable High-Q N-Path Band-Pass Filters: Modeling and Verification; Paper; Undated; 29 pages.

* cited by examiner

PERIODIC TIME SEGMENT SEQUENCE BASED DECIMATION

RELATED APPLICATIONS

This application is a continuation-in-part of co-pending U.S. application Ser. No. 13/827,966, filed Mar. 14, 2013, and U.S. application Ser. No. 13/830,092, filed Mar. 14, 2013, both of which are continuations of co-pending U.S. application Ser. No. 13/651,259, filed Oct. 12, 2012. This application claims the benefit of U.S. Provisional Application No. 61/808,206, filed May 24, 2013.

BACKGROUND

There are many different modulation schemes used to modulate a Radio Frequency (RF) carrier or an Intermediate Frequency (IF) carrier with a lower frequency modulation signal. There are different advantages and disadvantages to each of the commonly used methods. There are also many different wireless formats or standards used within the wireless product marketplace today. These standards differ not only in modulation technique used, but also in the bandwidth utilized by the wireless system, the RF bandwidth of a single channel, and the use, or not, of various spread spectrum techniques, such as CDMA (Code Division Multiple Access), frequency hoping techniques, or, most recently gaining in popularity, OFDM (Orthogonal Frequency Division Multiplexing). An idealized goal of a Software Defined Radio (SDR) system is to be able to transmit and receive using any of these techniques and to be able to switch between them by merely changing the software code running on such an SDR system.

Cognitive Radio Systems, as currently envisioned within the R&D community, include plans for flexible transceiver's, which can adjust to band utilization variations as needed, changing frequency bands, modulation techniques, and transmission bandwidths as required to make best use of the current RF environment. This discussion continues, yet currently there is not even a cost effective or efficient method to implement a fully flexible SDR.

Given the lack of fully flexible SDR technology, each of the many differing modulation techniques and wireless standards have historically required different customized analog front-end receiver blocks and customized back-end analog transmitter blocks for each bandwidth, modulation technique, or wireless standard accommodated. The concept of SDR has often been put forth with the promise of a single circuit block that could, under software control, be able to operate and provide competitive performance, while working with any of the current wireless transmission schemes. Yet this promise remains unfulfilled.

The roadblocks to achieving fully flexible SDR solutions have been many. The use of IF stages, creating difficult to manage spurs, and image frequency artifacts, also create overly complex matrices of usability limitations. Each combination of center frequency, bandwidth, and modulation scheme has required specific design attention despite a theoretically programmable feature selection. Quadrature modulation and all schemes which make use of phase variation add a great deal of complexity to both reception and transmission. Maintaining orthogonality and minimizing mismatches between the I and Q channels are ongoing challenges. Conventional zero IF approaches to the SDR challenge attempt to simplify the IF complexities, but compound the I/Q mismatch and orthogonality issues and typically degrade noise performance as well. Real solutions to the SDR challenge have seemed perennially imminent, while remaining ethereal.

DETAILED DESCRIPTION

Radio by its very nature, is about lower frequency modulation of one kind or another being used to modulate a higher frequency carrier, thus forming a band of frequency content, typically centered on a carrier. Selectivity, the technique of selecting which relatively narrow band of frequencies to respond to, has always been key to the signal reception process. Narrow band filtering is fundamental to this process, and the performance of the specific narrow band filters utilized has always been critical in determining the signal to noise ratio of received signals.

It is not surprising then to find a filtering technique at the crux of a new radio technology. Periodic Time Segment Sequence Based Decimation (PTSSBD) is, most fundamentally, a filtering technique, a discrete time decimation filter that achieves a narrow band or band pass response. The challenge of a fully flexible SDR system then, is to accomplish effective narrow band filtering, using fully flexible reconfigurable techniques that can be used throughout any band. Essentially, achieving fully flexible narrow band response, using broadband techniques. Periodic Time Segment Sequence Based Decimation achieves much of this goal.

There are many common terms used in the RF industry which are generally understood to have consistent meanings, but which can, by usage or by application, have slightly varying scope or specific meaning. For clarity, there are three terms which will now be defined very specifically, which in some cases will be used in place of more common usage meanings or terms, other such specific terms will be described upon initial use. A modulated signal is one such term, carrier signal is another, and modulation signal is another. A modulated signal is a signal which includes information representative of a modulation signal, which is superimposed, encoded, or modulated onto a carrier signal to become the modulated signal, and from which the original modulation signal can be recovered by some means. Generally, most if not all Radio Frequency (RF) signals are modulated signals, as are all Intermediate Frequency (IF) signals. The carrier signal is a single frequency sinusoidal waveform, generally higher in frequency than any of the spectral content of the modulation signal. The modulation signal is a signal superimposed on a carrier using any of a wide variety of modulation techniques common in the art.

Figure 1:
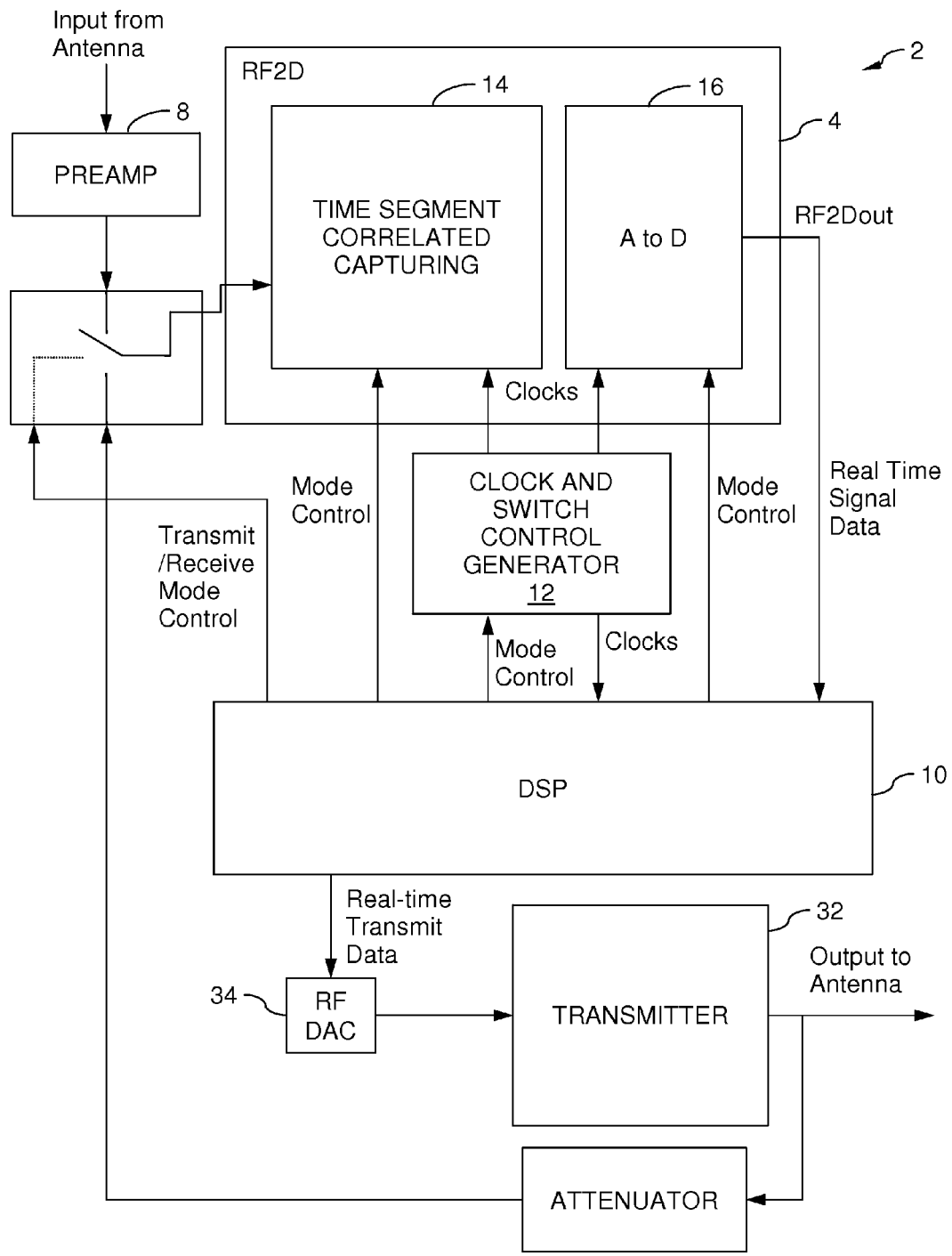
FIG. 1 is a system block diagram showing one embodiment of the present invention implemented in a time segment based software defined radio.

Developing a more ideal receiver solution for SDR has resulted in various novel methods, blocks, circuits, and systems. Although the present invention is not limited in scope to SDR applications. FIG. 1, shows a top level block diagram of a Time Segment Based Software Defined Radio (TSB-SDR) system 2, based on these developments. The RF2D block 4, a novel development, is an input block that receives a wideband modulated signal from a wide-band amplifier 8, or perhaps directly from an antenna, and outputs to a digital signal processor (DSP) block 10 a wide-band stream of data where each piece of data is representative of a modulation component and where the data is time segment correlated. A modulation signal component here is any quantity, value, or signal, which when combined with other modulation signal components, can form a representation of a modulation signal. A representation of a modulation signal thus formed is then referred to as a reconstructed modulation signal.

To understand time segment correlation, time segment must first be understood and defined. A time segment represents a span of the phase of a sequence clock signal, which remains essentially constant from one sequence clock cycle to the next in the phase angle of the sequence clock at which it begins and in the phase angle of the sequence clock at which it ends. Each cycle of the sequence clock spans multiple time segments, equal in number to the number of time segments in a time segment sequence. The number of time segments in a time segment sequence is an adjustable or programmable number, but regardless of how many time segments are selected to be within a time segment sequence, the entire sequence is repeated once per cycle of the sequence clock. While it is not necessary that time segments be contiguous, where every possible phase angle of the sequence clock is thereby included in one or another time segment; it is desirable that time segments remain non-overlapping so that no two time segments both include any one phase angle of the sequence clock. Generally, it is intended that time segments be nearly contiguous, so that every phase be included in one or another time segment, except for transition phases at the beginning or end of a time segment. However, it is possible to have time segments which have significant gaps between them, yet they should not overlap.

The sequence clock signal is an approximately constant frequency signal, generated by a local oscillator block 12, or timing system. For hardware synchronous applications of PTSSBD, the sequence clock becomes synonymous with the common usage of the term local clock, where local means within the context of the receiver system. Typical radio systems, anticipate that, during the normal operation of receiving a signal, a hardware local clock will be at the same frequency, and in a constant phase relative to a carrier signal used to construct the modulated signal input to the radio system. Generally, the actual carrier is generated at the transmitter, and the pure carrier signal itself is therefore not generally available at the receiver. Furthermore, the carrier signal is not necessarily even present within the modulated signal, depending on modulation and transmission scheme. For hardware synchronous systems, there are various methods used to establish the correct frequency and phase for a local clock. Most such methods use some form or other of either a phase or a frequency locked loop system. Such phase lock is generally achieved by first defining some window of time, established by timing format, during which the modulated signal can be relied upon to be representative of the carrier frequency, and to be at some known reference phase. However, precisely how this works can vary substantially from one system to another.

Generally, the term local clock has been used to refer to a hardware clock, generated locally within a receiver, which is made to be synchronous with some target modulated signal. However, for asynchronous signal acquisition, and for asynchronous applications of PTSSBD, the only local clock which synchronizes to an input signal may exist only in the software space. For a case, where the local clock exists only in software space, the term software defined local clock or the term soft local clock will be used. The term local clock will continue to be used here forward, nondescript in its type of "ware", representing either a hardware or software clock, yet always understood to be synchronous with a target modulated signal. The term sampling clock will be used in reference to what is normally the fastest clock in the system, which controls the rate at which the fully analog input signal is sampled in time to become a discrete time signal. The term sequence clock will be used in reference to a clock slower than the sample clock, which is the rate at which a complete sequence of time segments repeats. For hardware synchronous applications of PTSSBD, the sequence clock becomes synonymous with local clock.

In any case, the option to synchronize the sequence clock or the sampling clock in hardware to the carrier frequency of the target modulated signal always carries with it some additional overhead. This overhead comes in the form of additional complexity, and can also require some compromises in performance. For example, implementing a voltage controlled oscillator will often result in more jitter than a fixed frequency oscillator. In general, synchronizing the sequence or sampling clock to the input signal usually leads to a performance enhancement, but not always. There are target modulated signal cases where it is better to use a hardware asynchronous local clock. Depending upon the carrier frequency and bandwidth of the target modulated signal, particularly where the carrier frequency is low enough to allow a higher number of time segments per carrier cycle, the benefits of synchronizing the local clock in a hardware manner can be less significant, and be mitigated by other factors.

Some systems necessitate the demodulation of multiple modulated signals having different carrier rates, all in the same channel. For example, Doppler effects on GPS signals from different satellites can make it impossible to be synchronous with all of the satellites in a constellation at the same time. This would mean hardware synchronicity with one satellite signal assures that other satellite signals will be hardware asynchronous. The system herein described is an SDR system intended to be capable of receiving essentially any transmitted signal. It is therefore desirable for the system to be capable of all methods of frequency or phase lock, including where signal synchronicity is achieved only in software, perhaps with a phase locked loop or frequency locked loop implemented entirely in software. Such an approach requires that the hardware remain asynchronous.

For synchronous systems, the local clock, whether implemented in hardware or software, when in proper frequency and phase relationship relative to the carrier of the target modulated signal, can generally be said to be correlated in time to the modulated signal. It is important to note however, that this is not always a strong mathematical correlation in the strictest sense. Where the carrier is suppressed (not transmitted) and if the modulation factor is high (a statistically high percentage of the modulation range is utilized) this means there may not be very much of the carrier frequency contained in the modulated signal, such that the mathematical correlation may not be very high at all. In such cases, as long as the signal content of the modulated signal can still effectively be demodulated by any means, using the local clock at a frequency near or in the band of the modulated signal, then the local clock signal can still be considered as correlated in time with the modulated signal.

The term correlation is used far more strictly and quite differently for the term time segment correlation. Here, unlike with the local clock whose correlation in time with the modulated signal might be quite low mathematically, yet still be considered correlated, time segment correlation is intended to indicate a very high level of mathematical correlation, virtually 100%. Each time segment amounts to a window of time during which the modulated signal gets acquired or captured, with the value captured becoming associated only with the time segment active during the time of capture. The fact that time segments are non-overlapping ensures that any instantaneous time value of the input signal gets included in only one time segment. This maintains the independence of the modulated signal values so captured and the significance of the time segments as separate from one another. Signal transmitted or received within a time segments span remains isolated and separated from signal transmitted or received during other time segments.

Time segment correlation can now be understood, and signal or data can be understood to be time segment correlated whenever all data or signal captured during any one time segment of a time segment sequence is collected or captured and kept separate from data or signal captured or collected during any other time segment of the sequence. Wherever this separation is maintained, the data or signal can be said to be time segment correlated. Again, this correlation is a type of correlation where a high mathematical correlation is important in order for it to be time segment correlated. In fact, time segment correlation indicates a case where full correlation is virtually assured by design or by definition.

The data stream output of the RF2D converter block 4, RF2Dout, has an adjustable data rate, f_RF2Dout, adjustable under the control of the DSP 10 and generally chosen to be fast enough to at least provide Nyquist rate data relative to the widest band information present in the incoming signal. In this way, no loss of bandwidth in the data or signal received occurs within the RF2D block 10. It is important to note however, that it would be possible to allow a reduction in bandwidth, if so desired, within the RF2D block merely by selecting an RF2Dout speed slower than the Nyquist rate relative to the widest band information present in the incoming signal.

The first processing block within the RF2D block 4, is a discrete time processing block called Time Segment Correlated Capturing (TSCC) 14, or for applications where the sampling rate is synchronous, usually at some integer multiple frequency, with the target modulated signal (Synchronous Acquisition), this block is called Phase Sector Correlated Capturing. In any case, this capturing block is where the modulated signal input to the RF2D block 4 is broken up into discrete time segments and thereby sampled or acquired according to time segment, and then processed without yet being converted to a digital or binary representation of the signal. As such, the signal in this first stage still has full analog signal resolution, where the effective resolution is limited only by a noise floor present. This noise floor is formed as a combination of local circuit processing noise and noise present in the incoming signal.

In one embodiment, this discrete time block also includes multiple channels of low-pass filters, which act like discrete time decimation filters on the input data. There is one filter for each time segment. Each of these time segment correlated decimation filters has a decimation rate that is variable depending on the number of sequence clock cycles, or the number of time segment sequences over which the sampled values are acquired and combined to obtain filtered signal values. The simplest discrete time filter for this application is implemented by simply adding up (or "accumulating") the captured signal values (or "sampled values"), separately by time segment, from one sequence clock cycle to the next. In this way, each value captured during any one time segment of one cycle of the sequence clock is simply added together with signal values captured during the same time segment of subsequent sequence clock cycles.

Most typically, for higher frequency signals, this adding together of values essentially accumulates one additional value per time segment, once for every sequence clock cycle that occurs during the entirety of one full RF2Dout cycle period. However, programming which targets acquisition of many slower signals may gain more advantage by using more than one value per time segment. Also for cases where the sampling clock and the sequence clock have no fixed synchronicity, a varying or a dithering number of samples per time segment may be used. In any case, once accumulated, each method results in one value passed to the A to D block, and subsequently one digital value passed to the DSP for each time segment, for each RF2Dout cycle period. Since this occurs within a discrete time analog resolution block, the noise which is typically random or white in nature would tend to add up stochastically, whereas the signal tends to add up linearly. This yields a profound advantage for this methodology. This means the signal to noise ratio tends to improve as the signal is accumulated, by a factor roughly equal to the square root of the down-conversion factor, where the down-conversion factor is the sequence clock rate Fsclk divided by the RF2Dout rate, f_RF2Dout. This accumulation of values from one sequence clock cycle to values accumulated from other sequence clock cycles can generally be done with any value combining system, but is probably most simply implemented using switched capacitor techniques.

Another option, rather than down-conversion, is to pass the signal captured for each time segment to the A to D 16 at full speed, one value per time segment per sequence clock cycle. This amounts to f_RF2Dout=Fsclk, where Fsclk is the frequency of the sequence clock, which for hardware synchronous systems, becomes the same as the local clock, equal in frequency to the carrier frequency of the modulated signal. This would require that the DSP 10 process values coming in from the A to D 16 at a rate equal to the number of time segments per sequence clock cycle times the Fsclk rate. For processing a quadrature signal, that rate would be at least four times the Fsclk rate. Depending upon the carrier frequency involved, that can become a large amount of individual pieces of data processed very quickly, in effect using up a great deal of the DSP block's processing power. This can also generate quite a speed challenge for the A to D block 16. Under some signal conditions this might be the preferred processing method, particularly where Fsclk is not too high, but in most conditions, it is more desirable to reduce the input signal rate to the DSP 10, using the down-conversion option. In fact, in many systems this down-conversion capability is a fundamental enabler, without which, such a system simply cannot be made to work fast enough. Furthermore, this down conversion factor results in a narrower bandwidth, thereby helping to reject undesired signals relative to the targeted modulated signal.

Figure 4:
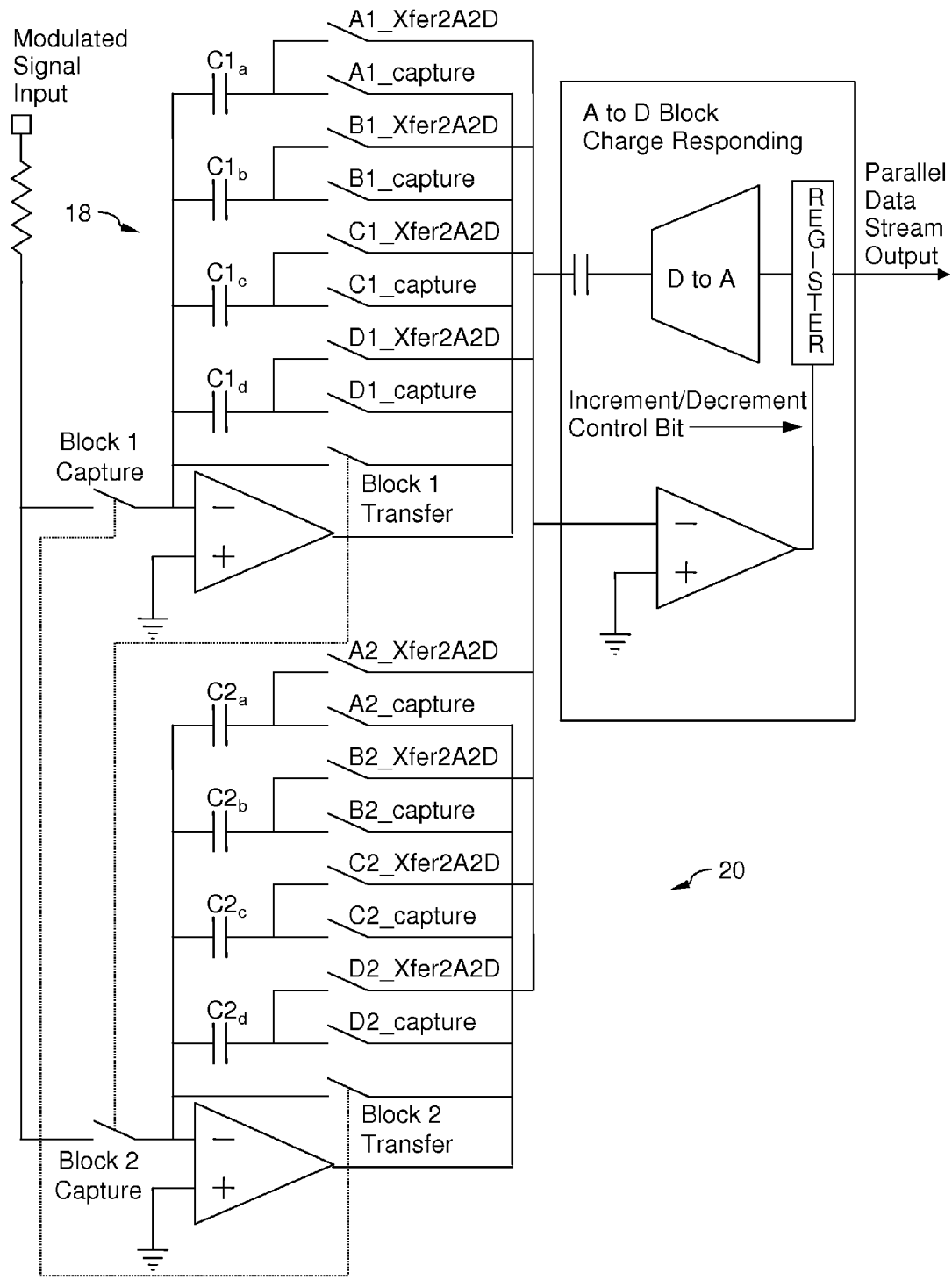
FIG. 4 is a diagram illustrating one embodiment of alternating blocks as time segment distributed integrators with a charge responding A to D.

For a flexible and programmable system, as this TSB-SDR system 2 is intended to be, it is generally desirable to be able to capture data nearly continuously. In order to avoid regular dumping intervals, during which the input signal is ignored, the RF2D block 4, in one embodiment, includes two identical discrete time processing input blocks, one receiving input values, while the other is dumping its values to a subsequent block, usually the A to D block 16. FIG. 4 illustrates one embodiment of these two blocks 18, 20 (accumulation blocks) for a time segment integration capturing system, described below. Each of these two blocks also has their value reinitialized during its dumping period, reinitialized to a level which the A to D 16 would receive and interpret as a zero value. This occurs after it has dumped its value to the A to D 16 but before it is reconnected to new input for its subsequent acquisition phase. In this embodiment, these two blocks are included within in the Time Segment Correlated Capturing block 14 of FIG. 1. These two blocks then alternate roles on alternate RF2Dout cycles. This allows the system to collect signal for every sequence clock cycle. Ultimately, this provides a better signal to noise ratio of the resulting recovered modulation signal, for any given modulated signal input, than a scheme which ignores any number of cycles of modulated signal input. This also potentially avoids, or at least minimizes potential aliasing problems, and the complexities of managing adjustable anti-aliasing filters.

Regardless of the carrier frequency of the target modulated signal, regardless of its bandwidth, regardless of the modulation scheme utilized, and regardless of the information the modulation contains; there is some selection of the Fsclk/RF2Dout down-conversion factor, the number of time segments per clock cycle, and the selection of sequence clock frequency; such that the resulting digitized time segment correlated values can be passed to the DSP block 10, containing the information necessary to fully decode, demodulate, filter, and present data in whatever form most desirable, for any RF signal which can be transmitted, and to do so in a way which provides the best signal to noise ratio possible. Because of this, this system is capable of the full flexibility envisioned in the original concept of SDR, as no conventional or prior art circuits or systems have been.

It is instructive to consider one specific type of modulation, to see how TSCC provides benefits for a specific case. Quadrature modulation is used for many different systems, 8QAM, 16QAM, and 32QAM to name a specific few, and countless others. Quadrature modulation is also key to consider because the quadrature relationship of the I and Q signals adds the significance of phase variation, as well as generally adding complexity to the demodulation process. A quadrature modulated signal is most simply processed using TSCC, with four time segments per sequence clock cycle. For the highest frequency RF signals that a given semiconductor implementation of the block can handle, this would almost certainly be the number of time segments chosen. However it is also important to note that for lower frequency RF signals, a higher number of time segments per cycle of the carrier or the sequence clock can provide various advantages.

Figure 2:
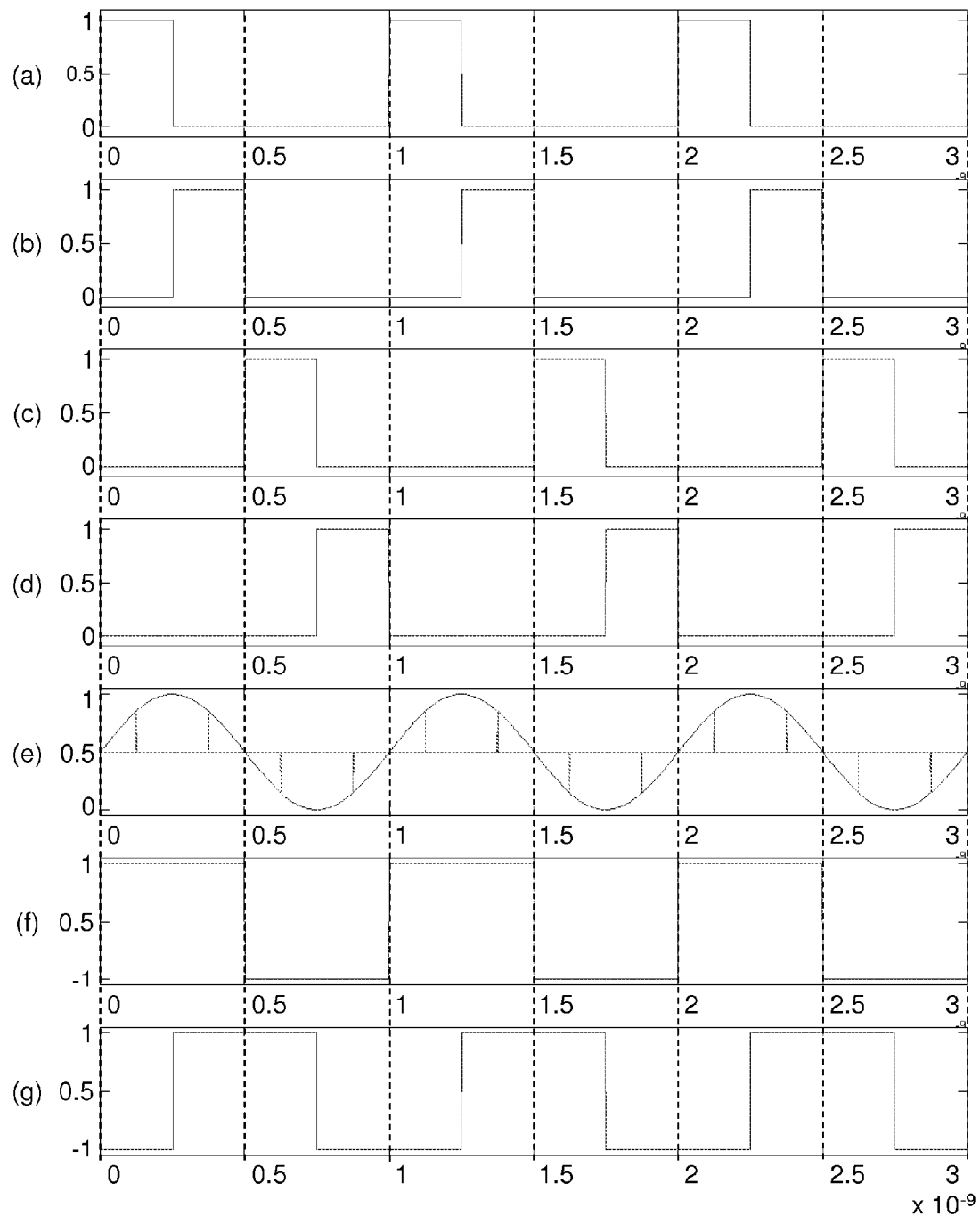
FIG. 2 is a timing signals chart for quadrature and time segment processing.

FIG. 2 includes waveforms, which show the timing relationships for each of four equally sized time segments shown as (a), (b), (c), and (d). In FIG. 2, (e) shows a cosine wave, in the ideal phase relationship with the timing signals of (a), (b), (c), and (d). In order to consider these timing relationships, FIG. 2 shows a synchronous case, such that a phase lock condition between the carrier that formed the modulated signal and the sequence clock exists. The effects of an asynchronicity will be considered below, see paragraph 42.

Simple impulse sampling may not provide the best signal to noise ratio, but is the most common method of acquiring a discrete time representation of a signal, and therefore an interesting case to consider. Applying TSCC to simple impulse sampling results in a technique described below as Time Segment Impulse Sampling, or TSIS. TSIS can be used for both hardware synchronous cases, and for asynchronous, but in both cases impulse sampling must be done at regular intervals. For now consider the synchronous case. This synchronicity, in combination with time segment correlation, requires that each time segment include an equal number of evenly time-spaced samples. For a four time segment or quadrature case, this necessitates an integer multiple of four samples per Fsclk cycle. The simplest case is again the best to consider, which is just the single sample per time segment case. The only remaining choice then is where to phase the impulse sample within the time segment. Aligning each impulse sample time with the center of its time segment, as shown by the impulse samples superimposed on the sinusoidal waveform in FIG. 2 at (e), is probably the simplest case to consider. Note, that for asynchronous hardware clocks, the exact phasing of this is generally not critical and of little effect.

Figure 5:
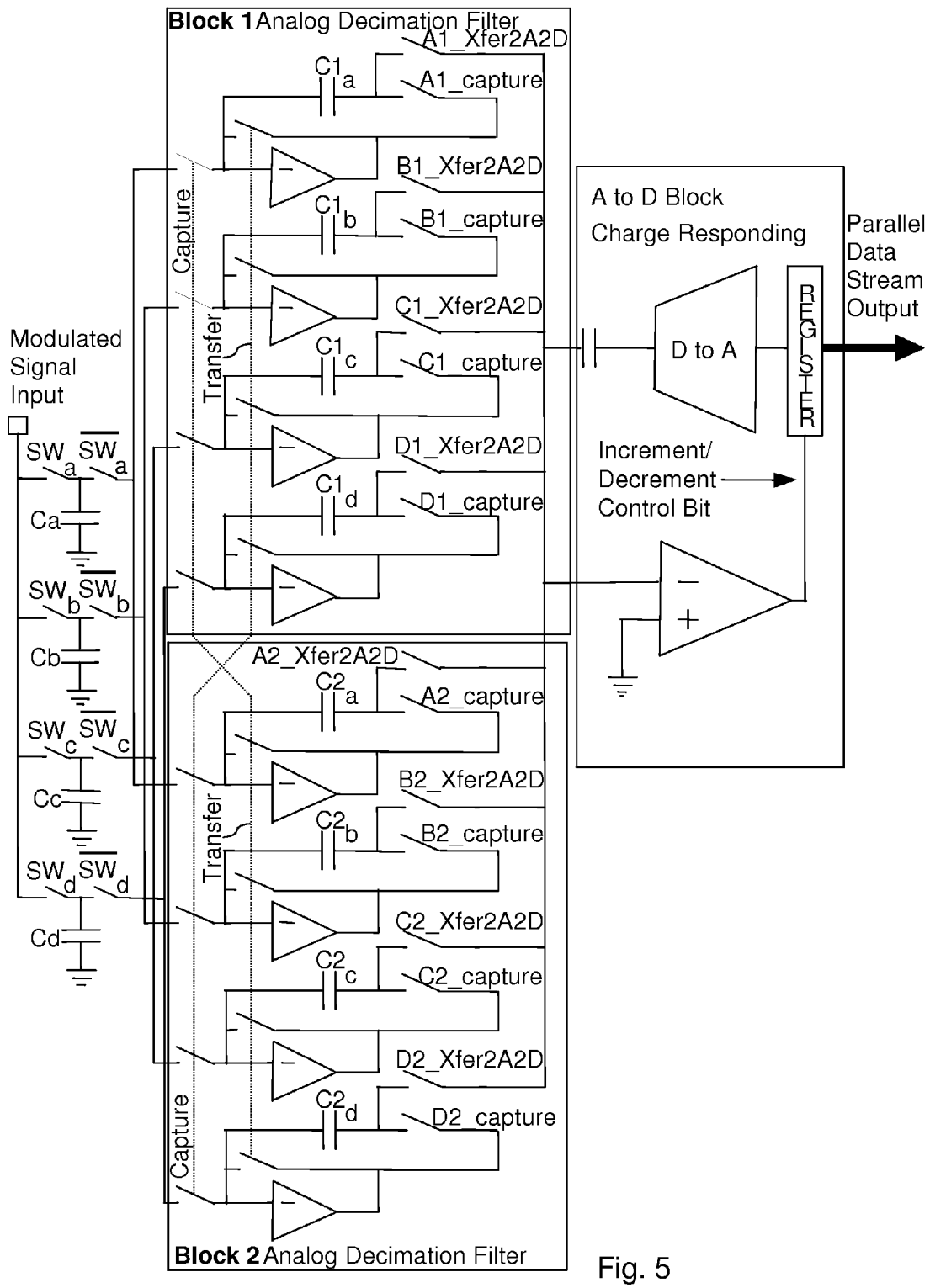
FIG. 5 is a diagram illustrating one embodiment of alternating blocks as time segment correlated decimation filters, or alternately each could also be considered a signal value combining system, combining sampled values by accumulation, and passing accumulated values to a charge responding A to D.

FIG. 5 is a diagram illustrating one embodiment of alternating blocks as time segment correlated decimation filters, or alternately each could also be considered a signal value combining system, combining sampled values by accumulation to obtain filtered signal values, and passing accumulated values (or filtered signal values) to a charge responding A to D.

Time Segment Impulse Sampling, TSIS operates by first acquiring a sampled value using an impulse sampling method, within an impulse sampling block. This is done for the TSIS system shown in FIG. 5 for each of four time segments, during the time when each of the sampling switches, SWa, SWb, SWc, SWd are closed. During each of these respective intervals, the sample capacitors Ca, Cb, Cc, Cd, each acquire whatever charge is necessary so that the voltage on the sample capacitor closely matches the input signal voltage by the end of the sample interval. This acquired charge then becomes the sampled value. It is instructive to note, that generally, with the use of switch-cap circuits, it is important to consider, and to factor out of the signal, any variation in offset voltages present at the input of op amps. These techniques are well understood in the art, so for simplicity, these details have been left out of FIG. 5. Any of these offset cancellation techniques could be used in conjunction with this circuit without altering its functionality pertaining to the concepts herein presented.

Once a sampled value is thus acquired on each of capacitors, the sampling switch is then shut off. Each of the respective complement switches, SWa_BAR, SWb_BAR, SWc_BAR, SWd_BAR then transfers the charge on the sample capacitor, the sampled value, to the accumulation capacitor of either the block 1 or the block 2 decimation filter, whichever one is in capture mode. Note that in the drawing SWa_BAR is designated by the letters SWa with a line above it to designate the BAR notation, indicating that the timing for SWa_BAR is the inverse of the timing for SWa. It is also important to note, that the timing for each of the complement switches is non-overlapping with that of the sampling switches, as is typical for most switched capacitor circuits, so that no sampling switch and its respective complement switch are ever on at the same time. The timing of the sampling switches relative to each other can be seen in FIG. 3b. However, it is important to note, that the timing of signals a b c and d of FIG. 2 are arranged to show the intervals of each time segment, but these are NOT phased the same as the switch control signals for the TSIS system. The effective moment of impulse sampling occurs at the end of the sampling interval.

This should occur at the moments of impulse sampling shown in FIG. 2 at (e), which as previously described, should occur at the center of a time segment, as shown in FIG. 2, for the case where only one sample is captured per time segment.

Each accumulation type decimation filter of FIG. 5 then continues to accumulate sample values by time segment during one entire cycle of the f_RF2Dout clock, At the end of that clock period the decimation filter which had been capturing, switches to transfer mode, and begins passing the accumulated values for each time segment to the A to D, one value at a time. While the other decimation filter block is then put into capture mode, and begins accumulating sampled values.

There are various uses of capacitors made throughout the circuits, systems, and blocks of the TSB-SDR 2. Each capacitor as described here and throughout this writing could be replaced with a capacitive device. A capacitive device, being any device or plurality of devices generally having two or more terminals, which has capacitance between two terminals such that it behaves like a conventional capacitor, in a manner sufficient so as to allow the circuit or system to behave approximately as it would if a capacitor were in its place, generally having an amount of charge stored on the device equal to the voltage across the device multiplied by its capacitance. For simplicity, the term capacitor will be generally used, with the understanding that it could be replaced by any capacitive device.

In FIG. 2, (e) shows an incoming modulated signal, having an all in-phase (I) signal, which means that the I component is maximized, and the quadrature (Q) component is zero. While a real RF signal would have phase variation, there are only three full cycles of the modulated signal shown. The bandwidth limitations on most RF signals, would not allow the modulated signal to vary significantly in phase over three cycles, so the pure sine wave shown for (e) of FIG. 2 is reasonably realistic over the time span shown. For this case, the impulse samples are also shown in FIG. 2 at (e), where there are four impulse samples per cycle of the modulated signal. From left to right, these impulse samples shown in FIG. 2 at (e) are for time segments A, B, C, D, A, B, C, D, A, B, C, D. In this case, the time segments A, B, C, D comprise a periodic time segment sequence having a plurality of ordered time segments. The sequence is periodic because it repeats the time segments. The tie segments are ordered because they repeat in the same order. TSIS allows for multiple impulse samples to be accumulated over multiple Fsclk cycles, as long as the accumulation is done separately for each time segment, yielding a separate accumulated value for each time segment, and so that any values accumulated together are captured within the same time segment, although probably over multiple cycles. This accumulation, for the TSIS case, can be accomplished with the addition of a switched-capacitor circuit designed for this purpose, FIG. 5 shows two such blocks. Here each switched capacitor filter provides an analog decimation filter, separately for each time segment, accumulating the sum of the values captured on a capacitor, for later transfer to the A to D block 16. For the signal state shown in FIG. 2 at (e), all of the time segment A values would be accumulated into a single value along with those from subsequent cycles, for however many local clock cycles are included in a single RF2Dout cycle. Accumulation is the simplest approach, but a more complex switched capacitor filter could also be used here to achieve steeper band response features.

From FIG. 2 at (e), it is plain to see that all of the time segment A values appear identical, as do all of the time segments B, C, and D values respectively. This is a direct result of the bandwidth of the target modulated signal being too narrow for the phase of the modulated signal to vary too quickly, in combination with the target modulated signal having a frequency within the pass band of the bandpass filter resulting from the down-conversion factor. (In fact, the frequency of the sampling as shown, appears as a case where the input signal is essentially synchronous with the input signal, to within the resolution of the drawing). As described above, the down-conversion ratio of Fsclk/RF2Dout would normally be chosen so that the bandwidth of the resulting RF2D output data would not be significantly reduced, which means generally, that there would not be much variation in the values of all of the A time segment values over the time of their accumulation. Whatever variation there is gets averaged over the accumulation. Naturally, this also applies to the B, C, and D values respectively.

Paragraphs 34 through 41 consider only the case where the sequence clock and sampling are synchronous with the target modulated signal, as shown in FIG. 2. However, if one asks the question how much error is introduced in resultant reconstructed modulation signal values, if the sequence clock remains asynchronous, yet near enough in frequency to the carrier of the target modulated signal to still be in the band defined by the down-conversion factor, in many cases the error will be tolerable, and perhaps even preferable to the added complexity of providing for hardware synchronicity.

The error due to using an asynchronous sequence clock is most likely to be tolerable for cases where the difference in frequency between the carrier of the target modulated signal and the sequence clock is small. Furthermore, the effective bandwidth, resulting from the down-conversion factor selected, becomes a significant factor in determining how much error is too much error. The higher the number of sequence clock cycles over which time segment correlated values are combined, (that is the higher the decimation factor), the more significant the phase mismatch errors in the combined values will become, for any given offset frequency between the sequence clock and the target modulated signal. For this reason, it may be desirable to use a wider bandwidth setting for the decimation ratio, (in other words, just average over fewer cycles of the sequence clock), and then compensate with a narrower band filter within the DSP block, for cases where the sequence clock is not made synchronous with the target modulated signal.

Generally, it is not the goal of the decimation ratio to narrow the band of the target modulated signal, but only to reduce the data rate out of the A to D and into the DSP down to a manageable rate. So, for the asynchronous case, If the entire band of the target modulated signal is within the passband of the decimation filter, this by itself ensures that the effects on the signal due to the error in frequency between the sequence rate and the target modulated signal carrier rate is going to be minimal in most cases. Furthermore, the frequency offset by itself will only cause a slow and constant rate of shifting phase between the signals, a rate of phase shift that will be averaged by the accumulation process. The soft local clock in the DSP will phase lock to the data acquired after the affects of this averaging of the phase shift are factored in, which means this will not even generate any static phase error.

One other effect of asynchronicity might be due to the fact that the target modulated signal band will no longer be precisely centered in the decimation band. This may create an asymmetry in the target modulated signal band as acquired. If this is so, it should be a small matter to compensate for this using a compensating asymmetric digital filter implemented within the DSP code.

Each of the values for time segments A, B, C, and D, whether combined over multiple Fsclk cycles or not, gets transferred and converted to a digital value by the same A to D converter 16, with resulting digital values then made available to the DSP 10, while their time segment correlation also is provided to the DSP 10, so that each value is still identified by the A to D as data resulting from time segment A, B, C or D. In this way the DSP can continue filtering or processing the data in any desired programmable manner, while maintaining its time segment correlation.

For applications where the input signal is an RF or IF or any modulated signal, mixing of these time segment correlated values can also then be easily performed by the DSP, or by any digital signal value combining system. The I or in-phase signal can be formed by adding data from the A and B time segments and subtracting the data from the C and D time segments, or I=A+B−C−D, where A, B, C, and D now represent digital values collected during each of their respective time segments, possibly over multiple Fsclk cycles. The Q or quadrature signal is similarly developed by combining the time segment values as follows, Q=B+C−A−D. In this way, each of these combinations yields one value for 1 and one value for Q per cycle of RF2Dout. The values thus acquired for I and Q are no different if the values for A, B, C, and D are first low pass filtered by time segment, and then combined to develop I and Q as shown here, or whether they are first combined or mixed by traditional means, and then low pass filtered.

The advantages of using a higher than minimum number of time segments per sequence or per local clock cycle of the target modulated signal are several. One advantage is that for lower frequency target modulated signals, using a higher number of time segments or time segments per cycle of the target modulated signal helps avoid aliasing and eliminates the need for tunable anti-aliasing filter blocks out in front of the decimation filter block. Otherwise, signal bands that are at harmonics of the target modulated signal can be aliased into the base-band data wherever only the minimum number of time segments are utilized (two for non-phase significant forms of modulation, or four for I and Q and other phase significant forms of modulation). This is because, with the minimum number of time segments per cycle, each time segment must then get weighted by either +1 or −1 in the DSP where the mixing is done, making the effective soft clock local oscillator injection into mixing essentially a square wave, such that any harmonics of the target modulated signal present at the input will get demodulated down to base-band along with the intended target modulated signal. For an I/Q case, increasing the number of time segments per cycle of the target from four to eight has a dramatic effect on the ability to filter out those undesired harmonics of the target. This is because with eight values, the weighting values applied to the time segment accumulated values while mixing in the DSP block are far more gradually varying and can more closely approach the ideal sinusoidal mixing, compared to the binary mixing which results from 4 values per cycle of the target.

Another reason why a larger number of time segments per sequence, or per local clock cycle, is desirable is its effect on the noise level in the signal detected. A larger number of time segments for a given target frequency essentially provides more data points to be combined into a final value. This has the similar effect as increasing an oversampling factor, on reducing the error or noise in the signal so obtained.

A third value to having a higher number of time segments per sequence is that it increases the time resolution of the data acquired. This in effect means that when processing data in the DSP, there is a higher density of time samples to process with, meaning a higher effective time based resolution on the data, resulting in higher resolution control and measurement of frequency and time.

Generally, for all of the reasons above, the higher the sample clock frequency the better. This is true whether the sample clock is synchronous or asynchronous with any input target modulated signal. Of course, for the asynchronous case, the frequency of the sequence clock must be chosen to be near enough to that of a target modulated signal, so that the target modulated signal is still in the pass band of the resulting decimation bandpass filter. As long as this is done, and asymmetrical effects on the pass-band of the target modulated signal are compensated for, then the use of a software defined clock, also referred to herein as a soft clock. Is likely to work nearly as well as a hardware synchronous case.

The conventional approach to performing a hardware phase locked loop (PLL) function is to use a phase comparator that compares the phase of a received modulated signal to that of the local clock, usually during a predefined reference period discerned from receiving a signal with the proper timing format. The phase comparator most conventionally uses a four quadrant multiplier or an exclusive-OR block that essentially implements a binary type multiplication on the two input signals, where one is the local clock and the other is the received modulated signal, where the multiplier is only on during a predefined phase reference period. When not on, the output of this phase comparator is disabled and a low pass filter, most often just a single capacitor, holds its voltage unaltered until the next predefined reference period occurs. This type of phase comparator tends to cause a phase lock loop to lock with the two inputs to the phase comparator in quadrature with one another, that is 90 degrees out of phase, which results in an equal period of charging the hold capacitor as discharging it per local clock cycle, during the predefined reference period. The output of this phase comparator is often that of a charge-pump, charging or discharging the hold capacitor in response to the relative phase of the local clock and reference period signal. The voltage on the capacitor then typically becomes the control voltage input for a voltage controlled oscillator.

This same functionality can be achieved, using time segment correlated capturing as applied to a quadrature modulation case, by employing a digital low pass filter technique on the post conversion mixed Q signal, developed within the DSP, or, alternately, by acting on a separately developed control signal having control signal values developed within the DSP from accumulated values previously discussed. This low pass filtering would then be done to obtain a control value or voltage to be applied as a control input to the local oscillator, thereby controlling its frequency, as with a convention Voltage Controlled Oscillator, (VCO), and thereby forming a PLL 10. Alternately, some of the low pass function could be reserved for an analog final stage, which could be a charge pump type design, either charging or discharging a hold capacitor, similar to that of a conventional PLL phase comparator output and VCO control input, but with the signal driving it being a digitally low pass filtered version of the Q signal. This digital low pass and/or charge pump could then be programmed, under the control of the DSP 10, to be enabled only during the correct reference period, thereby again creating an effective sample hold on the phase comparator output. The voltage on the hold capacitor is then applied to a VCO, and so controls the oscillator frequency used to develop the local clock, and the timing of the four time segments. This now essentially forms a fully programmable PLL. The programming for this could be changed. The precise filter response of the low-pass could be changed as with the rest of the features of this SDR system 2, to accommodate any signal/modulation format, now including the timing details of the desired phase reference period. The programming could also be changed in response to signal conditions, by having a control signal evaluator, probably formed merely by program steps operating within the DSP, which can evaluate the control signal described above, before it is low pass filtered, or any of the other signals otherwise developed within the DSP, comparing the signals to any number of characterization metrics, many determined by mere mathematical processing of the control signal, to determine what the low pass filter characteristics should be, or to determine how the control signal is processed in developing the control value or voltage used to control the VCO.

Similarly for an asynchronous case, using the Q data stream as the software based phase comparator of a software based PLL is also likely to be the best choice for many target modulated signals.

Mixing the accumulated values after any down-conversion desired, and after A to D conversion has taken place, constitutes a novel methodology called Post Conversion Mixing. This Post Conversion Mixing is advantageous in every way, as it provides for virtually no mismatch between either the I and Q channels, nor between either of those and the phase detection mixing traditionally used to provide the control voltage to control the voltage controlled local oscillator of the PLL. All of this mixing is now done post down-conversion and post analog to digital conversion, and is therefore acting on data which has been processed through a single analog block and a single analog to digital conversion process. I and Q are now formed by mathematically mixing identical data. This leaves essentially no place for I/O mismatch to occur within the receiver. This is a major advancement over conventional techniques.

Since the actual mixing occurs post conversion, in the DSP block, or in some other digital signal value combining system, the RF2D converter block can be considered merely an RF to base-band translation and down conversion block. A very unique block however, in that it converts to base-band, a signal which still contains both I and Q in a single signal. The output of this block is a number of separate outputs equal in number to the number of time segments in a sequence. Each output is a base-band output, with a band limit determined by the down conversion factor. This is much like a direct conversion receiver except that multiple different time segments of the RF signal has been direct converted down to base-band, a number equal to the number of time segments in the sequence. Since no real mixing has occurred yet, this signal processing method has applications much broader than merely RF signal processing.

This method of using a periodic time segment sequence as a pattern by which to process an input signal, whether synchronously or asynchronously, achieves a effective band pass filtered acquisition of an input signal, which can be subsequently passed to an A to D, or to any other additional processing circuits, at a rate which is directly related to the bandwidth of the now band pass filtered input signal, rather than related to its absolute frequency. This is a novel technique broadly applicable and valuable to many different signal processing applications, not just for a modulated signal input. This most directly applies to applications where the signal of interest is a band pass signal. Furthermore, all the advantages of using this technique, including the signal to noise performance enhancement, apply to this wider scope of signal processing applications as well.

Previously, a method implementing TSCC using standard impulse sampling techniques was described, TSIS. An alternative to TSIS is to use Time Segment Integration Capturing (TSIC), a novel technique capable of improved noise performance and capable of continuous signal capturing, a further enhancement to be described in detail below.

Figure 3A:
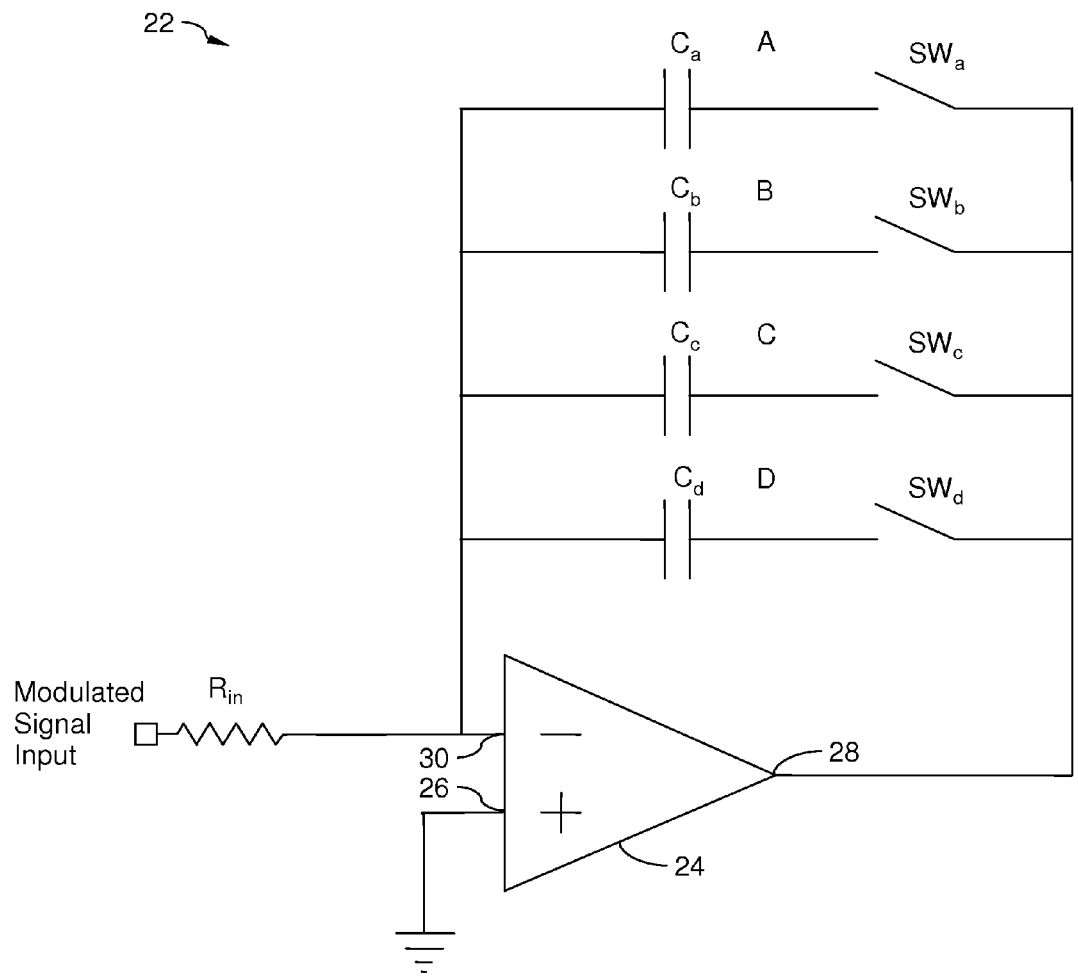
FIG. 3*a* is a diagram illustrating one embodiment of a time segment distributed integrator of the present invention.

The most straight-forward or simplest way of implementing Time Segment Integration Capturing, is to consider FIG. 3a, a time segment distributed integrator 22. For FIG. 3a, this block 22 and its signal timing is arranged to show a specific case of Time Segment Integration Capturing, and a special case of Time Segment Distributed Integrator, where the system is set up to perform quadrature detection. Similarly to the description above considering the use of impulse sampling, this arrangement also includes a specific selection where there are four time segments per sequence clock cycle, and where the phase relationship between the sequence clock and the incoming modulated signal appears phase locked, just as in the impulse sampling case, in a manner suggesting that the frequency of the sequence clock and that of the incoming modulated signal are very close.

The input signal, a target modulated signal, which might be received directly from an antenna, or from a very wide-band amplified version of signal present at the antenna, or perhaps an attenuated output of a transmitter, is applied to one side of a resistor Rin, where the other side of the resistor is connected to the inverting input of an ideal op-amp 24. The positive input 26 to the op-amp is connected to a DC voltage reference level, which might be ground, and is certainly an effective AC ground. The output 28 of the op-amp is connected to four switches, SWa, SWb, SWc, SWd (for the quadrature case), where only one of the switches is closed or on at any one time. The other side of each switch is connected to one side of a capacitor, Ca, Cb, Cc, Cd, with the other side of the capacitor Ca, Cb, Cc, Cd connected back to the inverting input 30. Each switch SWa, SWb, SWc, SWd is connected to its own capacitor Ca, Cb, Cc, Cd. In this way, because of the switches SWa, SWb, SWc, SWd, only one of the capacitors Ca, Cb, Cc, Cd is connected at any one time. While one of the switches SWa, SWb, SWc, SWd is closed, the op-amp 24 acts on the capacitor Ca, Cb, Cc, Cd through the switch SWa, SWb, SWc, SWd, providing whatever voltage is required to keep the inverting input of the op-amp 24 essentially and approximately equal to the positive input 26 of the op-amp 24. Since the inverting input node is then maintained at a constant voltage, in this case at ground, any signal present at the input side of the resistor Rin, is converted into a current through the resistor Rin. This current has no where to go except through the capacitor Ca, Cb, Cc, Cd having its related switch SWa, SWb, SWc, SWd on. In this way each capacitor Ca, Cb, Cc, Cd, is charged with a current that is a replica of the input signal, and thereby the charge on the capacitor Ca, Cb, Cc, Cd becomes proportional to, and a replica of, the integral of the input signal during the period when its associated switch SWa, SWb, SWc, SWd is on. In this way, this block 22 becomes essentially a time segment accumulator, accumulating a value, in this case charge, over each non-overlapping, timing system developed time segment.

Each of the four switches SWa, SWb, SWc, SWd is then sequentially turned on, after the other switches SWa, SWb, SWc, SWd are all off, so that there is no overlapping time period where more than one switch is on. This prevents charge representing signal, which has correctly been acquired onto one capacitor Ca, Cb, Cc, Cd, from being altered by signal during a different phase of clock, or by charge on an alternate capacitor Ca, Cb, Cc, Cd. The timing of the turning on of each of the switches SWa, SWb, SWc, SWd is sequentially arranged, so that any one switches SWa, SWb, SWc, SWd period of on time, always follows the on period of the same other switch SWa, SWb, SWc, SWd. So, each switch and capacitor combination A, B, C, and D, is named so that the time when switch SWa is on always follows when switch SWd is on, SWb always follows SWa, SWc always follows SWb, and SWd always follows SWc, these four periods together complete one full cycle of the sequence clock.

Figure 3B:
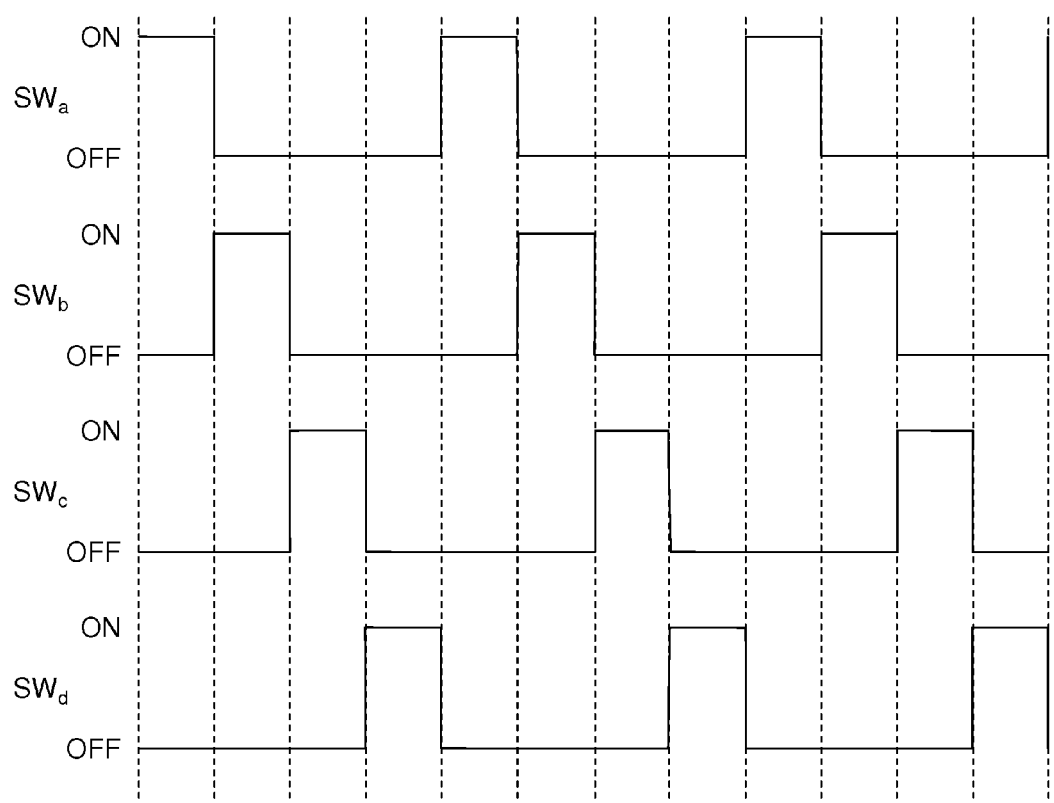
FIG. 3*b* is a timing diagram for the diagram of FIG. 3*a*.

As described above, the circuit from FIG. 3a operates so as to integrate the input signal current, and thereby store a charge on each of the capacitors, which is proportional to the integral of the input signal over the period where the switch associated with that capacitor is on. This then results in charges, referred to as Qa, Qb, Qc, and Qd, which are the charges representative of accumulated values, specifically analog accumulated values, on each of the four capacitors Ca, Cb, Cc, Cd of FIG. 3a, during periods A, B, C, and D, respectively. FIG. 3b shows the timing of SWa, SWb, SWc, and SWd.

After as few as one full cycle (or perhaps after multiple cycles) each of the capacitors Ca, Cb, Cc, Cd, which have now accumulated a signal related charge as an accumulated value, are then dumped into a charge responding A to D converter 16, where a digitized accumulated value is developed, which is directly proportional to the amount of charge accumulated on each capacitor Ca, Cb, Cc, Cd. A separate A to D output value is acquired for each time segment value, one for the charge accumulated during each of quadrature time segments A, B, C, and D.

If the conversion to digital is done at the end of every sequence clock cycle, there is one digital value for each quadrature phase A, B, C, and D, for each sequence clock cycle. However, if the integration continues over multiple sequence clock cycles, then there is only one digital value generated for each quadrature phase A, B, C, and D, for each multiplicity of sequence clock cycles. The number of cycles over which the integration continues before executing an A to D on the integrated values, becomes the down conversion factor. If the integration continues over five cycles, then the accumulated value converted by the A to D 16 is first integrated for each quadrature phase, over five cycles, and the value converted to digital is effectively an average of the input signals integration by time segment, over the five cycles. This effectively executes a down conversion by a factor of five. This means the A to D 16 does not have to execute an A to D nearly as quickly. Furthermore, as before with the impulse sampled case, the data is averaged, so any random noise is reduced, while the signal in effect, gets larger because of the ongoing integration. None of the desired pass band data is lost unless the down-conversion factor becomes large enough to result in a restriction of the bandwidth to a value that is narrower than that of the data contained in the modulation of the modulated signal. Ideally, the down-conversion factor is chosen so as to make the bandwidth just large enough to avoid significantly limiting the bandwidth of the data. The exact bandwidth chosen would likely be chosen to provide the best signal to noise ratio of the resulting data.

If a sequence clock circuit which generates the full cycle described above, is synchronous (at the same frequency) with the carrier frequency of a modulated signal present at the input of the circuit of FIG. 3a and if the static phase relationship between the sequence clock and incoming modulated signal is correctly set, the analog accumulated value represented by the charge accumulated on each of the capacitors Ca, Cb, Cc, Cd, after one full cycle, could then be selectively combined together in the correct polarities, and thereby reconstruct one RF cycle's worth of demodulated I and Q base-band signals, for that cycle.

Time Segment Integration Capturing can be used in this way, to achieve modulation signal values, using analog discrete time methods. Selectively combining each of the capacitors charge values, with the correct polarity selection for each, amounts to the mixing function, and thereby reconstructs analog discrete time in-phase or quadrature signal values. This combining can be accomplished using any accumulated value combining system. Where the processing block is analog, the values are usually charges, and the combining is most commonly implemented using switched-capacitor techniques. Where the combining is accomplished using digital values, the accumulated values are just digital values in active memory, and the accumulated value combining system generally becomes a mathematical step executed by a program running on or within a DSP block. Considering the case where analog modulation signal values are formed before digitization, this is done for each clock cycle, according to $Qi=Qa+Qb-Qc-Qd$, and $Qq=Qb+Qc-Qa-Qd$, where the charges Qi and Qq so formed are now representative of modulation signal values, analog modulation signal values, with Qi as a charge representing an in-phase modulation value, a single cycles reconstruction of the in-phase modulation, and with Qq representing a quadrature modulation value, a single cycles reconstruction of the quadrature modulation.

As described earlier however, there is great advantage in performing this mixing function in a post conversion manner instead. The point here is that these analog accumulated values contain the significance of the quadrature and in-phase signal components, and that this is one alternate and novel way that this time segment Integration Capturing technique could be used. If this system were used this way, where discrete time analog modulation values are formed, it is also possible to then further combine these already mixed analog values, using a modulation value combining system, which would combine modulation values from multiple clock cycles, inherently creating a discrete time filter. This modulation value combining system could also be implemented within the DSP block, merely by performing the correct mathematical operations on digitized modulation values. Where implemented, this modulation value combining system would most typically be used to create a low pass, discrete time, or digital decimation filter.

The distributive property of multiplication over addition also applies over accumulation and suggests that if charge is accumulated first by time segment and the accumulated values are then combined together in the correct polarity, that the resultant can be no different than if the values are first multiplied by the correct polarity and then accumulated all at once. Conventional mixing is achieved by multiplying the modulated signal by the correct polarity, and then accumulating all at once. This is necessarily done separately for I and Q, once multiplying by the in-phase clock, FIG. 2 at (f), and once by the quadrature clock, FIG. 2 at (g). Each of these mixers outputs then get separately low pass filtered, similar to integration over its reject band, which is essentially accumulated all at once, without regard to time segments. Time Segment Integrated Capturing can achieve the same resultants, but in a way that provides much greater flexibility by accumulating by time segment first, then combining in the correct polarity to achieve modulation signal values.

For full flexibility, selective combining of accumulated values can be performed on digital accumulated values, after digitizing the analog accumulated values. The option of reconstructing the modulation signal value before digitization, by selectively combining the analog accumulated values, has already been described. Alternately, under some signal conditions, some portions of this selective combining might be performed before the A to D, with others left until after the conversion to digital. In some cases, this can be done by merely reconnecting using switched-capacitor techniques, the capacitors of FIG. 4, during different time segments of the four time segment clock. This combines multiple time segment accumulated values before the A to D conversion.

One novel and advantageous case of this, an alternate value combining system, is to again selectively combine the four time segment correlated analog accumulated values, but now to obtain two analog accumulated values to be A to D converted for each sequence clock cycle, the charge values Q1=Qb−Qd, and Q2=Qa−Qc. This is particularly advantageous if frequency content slower than the desired signal were present as a large interfering signal. In this way the large interfering signal can be canceled, before it uses up range of the A to D converter 16. This is most directly accomplished using switched-capacitor type techniques, by reconnecting the integrating capacitors of FIG. 4, or perhaps by connecting the two non adjacent time segments to be combined, both to the charge responding A to D simultaneously. This option reduces the A to D conversion rate to two values per cycle, while also maintaining the benefits of post conversion mixing for the I and Q reconstructed modulation signals. This is another alternate enhancement of the current invention and is achieved by arranging clocking and switching of the capacitors of FIG. 4 so that two of the charging phases are combined and only two complete charge integrations are accomplished per full cycle of the clock, with each being a combination of two non-adjacent quadrature time segments of the full cycle clock. The I and Q signals can then be post conversion mixed using the digital modulation signal values obtained from performing the A to D conversion on Q1 and Q2, and where now Qip=Q1+Q2=Qa+Qb−Qc−Qd, and Qq=Q1−Q2=Qb+Qc−Qa−Qd.

This alternate combining system is one of several ways the RF2D 4 can be setup to accumulate and operate on the modulated signal, the accumulated values, and the modulation signal values. Different setups are likely to yield better signal to noise ratio than others, depending on signal conditions. These signal conditions can include a large set a variables, strong or weak signal, whether or not there is a strong interfering signal nearby in frequency or physically near the receiver so that it is overwhelming the desired signal, or whether or not there is rapidly changing fading conditions, just to name a few. The program running in the DSP 10 can adjust the selection of setups, to get the best signal to noise ratio, under current signal conditions.

As previously mentioned, it is intended here that there be no time during which more than one of the four switches SWa, SWb, SWc, SWd are simultaneously on. Given the imperfections of real timing and variations, it is difficult to avoid any simultaneous on time, without also providing for a period of time, however short, when all of the switches SWa, SWb, SWc, SWd are intentionally off. This would of course create a period of time, however short, where the input signal is ignored. This can lead directly to aliasing. One way of overcoming this is to make use of parasitic capacitance at the inverting input 30 of the op-amp 24. During any period where all of the switches are off, a transitory period, the parasitic capacitance at the inverting input of the op-amp 24, representing an auxiliary capacitive device, will begin to accumulate charge, and allow the voltage at the inverting input 30 to rise slightly. The charging of this auxiliary capacitive device continues until the next time segment begins. As long as the next time segment switch SWa, SWb, SWc, SWd turns on before this voltage rises too far, the voltage would be pulled right back to within its proper operating range as soon as the next switch turns on, while the charge that was accumulated by the parasitic capacitor at the inverting input would be redistributed exactly, onto the integrating capacitor Ca, Cb, Cc, Cd whose switch SWa, SWb, SWc, SWd is now on. In this way, after the switching transients have settled, the now on capacitor Ca, Cb, Cc, Cd would hold the same charge as if its switch SWa, SWb, SWc, SWd had been turned on fully at exactly the instant the previous switch SWa, SWb, SWc, SWd had been turned fully off.

Operating a time segment Integration Capturing system in this way, assuring that there is no period of time during which the input signal is ignored by subsequent processing, is an advantage referred to as Continuous Signal Capturing. One major reason why this is so advantageous is that this completely avoids any need for anti-aliasing filters, and avoids the complexities of managing adjustable anti-aliasing filters otherwise required for a fully flexible receiver. Continuous Signal Capturing is achieved by performing continuous accumulation on the input signal. Whenever the input signal is no longer accumulated on the most recently charging integration capacitor Ca, Cb, Cc, Cd, it is now effectively becomes accumulated on the subsequent time segment's capacitor Ca, Cb, Cc, Cd. Using another circuit architecture might require using one or more capacitive devices devoted to this auxiliary capacitive device's purpose, but with the time segment Distributed Integrator circuit configuration, this parasitic input capacitance at the non-inverting input 26 of the op-amp 24 accomplishes this added feature, without the addition of a device devoted to this purpose. There are also other ways of accomplishing continuous signal capturing, though they are more complex in nature. This however, does not detract from the novelty of this entire methodology.

Another valuable enhancement to time segment Integration Capturing, novel to time segment Integration Capturing, is the fact that by selecting to accumulate the modulated signal input over multiple cycles of the sequence clock, a time segment Distributed Integrator block can accumulate time segment correlated values for time segments, A, B, C, and D, which represent low pass filtered, or decimation filtered accumulated values. In this way, the charge stored on capacitor Ca gets added to, by additional charge during a second phase A of a subsequent full cycle, and by each phase A of multiple subsequent full cycles. The charge already on capacitor Cb gets added to by a second and multiple subsequent phase B portions of second or multiple full cycles of the set of four switches. Capacitors Cc and Cd also, can thereby integrate charge over multiple full cycles of the set of four switches SWa, SWb, SWc, SWd. Charges accumulated in this way are still time segment correlated, with each capacitor Ca, Cb, Cc, Cd accumulating charge only during its active time segment of each sequence clock cycle. This is similar to the low pass filter used in conjunction with the impulse sampling method previously described, the simplest of which just adds up the input samples. However, with this integrating block, there is no additional circuitry required, and no additional components being clocked at the fastest clock rate, effectively 4 times the sequence clock rate. The same integrating capacitors Ca, Cb, Cc, Cd just continue to add up the charge over multiple sequence clock cycles. Just as with the impulse sampled input, the signal adds up over multiple sequence clock cycles, and the resulting integrated charge can be made available to a subsequent A to D converter 16 at a much slower, down-converted rate. There is also the same improvement in signal to noise ratio resulting from the averaging of the time segment correlated charge components over time, as they are integrated onto each of their respective capacitors Ca, Cb, Cc, Cd, linearly compounding the amount of charge that is in response to the signal, while adding only stochastically, the amount of charge that is present on the each capacitor Ca, Cb, Cc, Cd due to noise.

While band narrowing does occur as a result of integrating the input signal over multiple full cycles of A, B, C, and D phases, this band narrowing is a function of the down-conversion factor, which is just Fsclk/f_RF2Dout, and which is under the control of the DSP 10. As before, this down-conversion factor can be chosen so as to not narrow the band of the information contained in the modulated signal, or it can be chosen to narrow the band, if so desired.

Subsequently, both I and Q are first formed after digitization has occurred using a single A to D block 16. I and Q are formed in the DSP 10 by combining, in the right polarity, the values collected during each of the quadrature time segments. This again constitutes Post Conversion Mixing with all of the same advantages as previously described, all profound in several ways. The mixing and filtering to provide the control voltage for the voltage controlled oscillator portion of the PLL is also the same as previously described.

Various methods of reconstructing a modulation signal have been discussed here. Each of the methods discussed has some combination of RF environment or receiving conditions under which it might represent the best method of signal reception. This TSB-SDR system is capable of switching between all of these methods as signals are being received. This switching can be done in some cases by changing the signals clocking various switched-capacitor circuits, in some cases by switching different components in or out of the circuits, and in many cases by merely altering the program steps that are being applied to the digitized signals as they propagate through the DSP block. These choices can all be made under program control, by any programmable control unit, which most typically is just the DSP block. This can be done in response to a modulation signal evaluator, which is most likely constituted by lines of code in the program running on the DSP, but might also be implemented in some cases, by dedicated hardware circuitry. In either case, this modulation signal evaluator can evaluate the reconstructed modulation signal relative to any number of characterization metrics, many determined by mere mathematical processing of the reconstructed modulation signal, which could be done by any processing system, but generally for this TSB-SDR system, the processing system is the DSP block.

Everything described to this point has mostly been describing the various features of this TSB-SDR system 2 as applied to achieve a receiver, receiving a modulated signal. The transmitter portion of a radio system can also be greatly enhanced by all of the previously described techniques. A number of conventional transmitter methods and techniques can be applied to this system, while managed from the DSP block 10 of this TSB-SDR 2. This system provides for a relatively wide-band, and thereby a relatively fast, acquisition of reconstructed I and Q modulation signal values from a modulated signal. This enables the use of a closed loop feedback system, which is amply stable, incorporating the transmitter block in the loop. For transmit mode, a transmit/receive mode control, generally a control signal or control bit from the DSP block 10, switches the modulated signal input to the TSCC block 14 from a received signal over to an attenuated version of the transmitter's output. The TSCC block 14 then provides reasonably quick feedback to the DSP block 10, so that it can compare the actual transmit signal to a desired transmit signal and make calculated adjustments to the signals driving the transmit block 32, as necessary to achieve the desired transmit signal at the output of the transmitter 32. In this way, the output of the transmitter 32 is in effect regulated to match the desired signal, so that the desired transmit signal is achieved at the output of the transmitter 32, greatly mitigating non-linearities, and thermal non-idealities, of the transmit block 32. Conventional systems have not been able to take this approach, because conventional systems have much too much delay in any signal path which reconstructs a modulation signal or component from a modulated signal by conventional means.

The digital transmission values that are output from the DSP 10 are converted to analog values by the RF DAC 34. This DAC 34 also includes a fast time segment Distributed Output block, which steps through various analog time segment correlated output values, providing each value in the form of either a current or a voltage proportional to this time segment correlated output value to the transmitter 32 for transmission. The values that are distributed for each time segment are generally updated much more slowly, by a digital to analog conversion of the data provided by the DSP 10. Because of this arrangement, the data update rate out of the DSP 10 does not have a full RF transmission rate, but can have an update rate more on the order of the bandwidth of the resulting RF transmission, rather than up at the carrier frequency.

This TSB-SDR system 2 provides for a zero IF, direct RF down-conversion technique, which converts as directly as possible, an RF band-constrained signal located at a center frequency, to a clocked parallel data stream. The center frequency at which RF information is down-converted from is determined by the frequency of the sequence clock, Fsclk. This sequence clock is developed by the sequence clock generation block 12, under the control of the DSP 10. A down-conversion factor is given by the ratio of the sequence clock to the frequency of the complete cycle output rate of the A to D conversion block 16, or Fsclk/f_RF2Dout. This ratio is an integer ratio, also controlled by the DSP block 10. One block within the TSB-SDR 2, the RF2D 14, essentially performs an RF to digital conversion. The output of this block 4 is a stream of multiple bit wide data, provided to the DSP block 10. The TSB-SDR 2 incorporates a transmitter 32, also controlled by the DSP 10, with a reconstructed modulation signal generated by the RF2D block 4 from the output of the transmitter fed back to the DSP 10, allowing the DSP 10 to maintain closed loop control of the transmitted output signal. This system is capable of receiving and transmitting in accordance with any transmission or wireless standard, requiring only programming to do so, and is limited in RF application only by the operational bandwidth limitations imposed by the semiconductor process into which it is fabricated.

Figure 6:
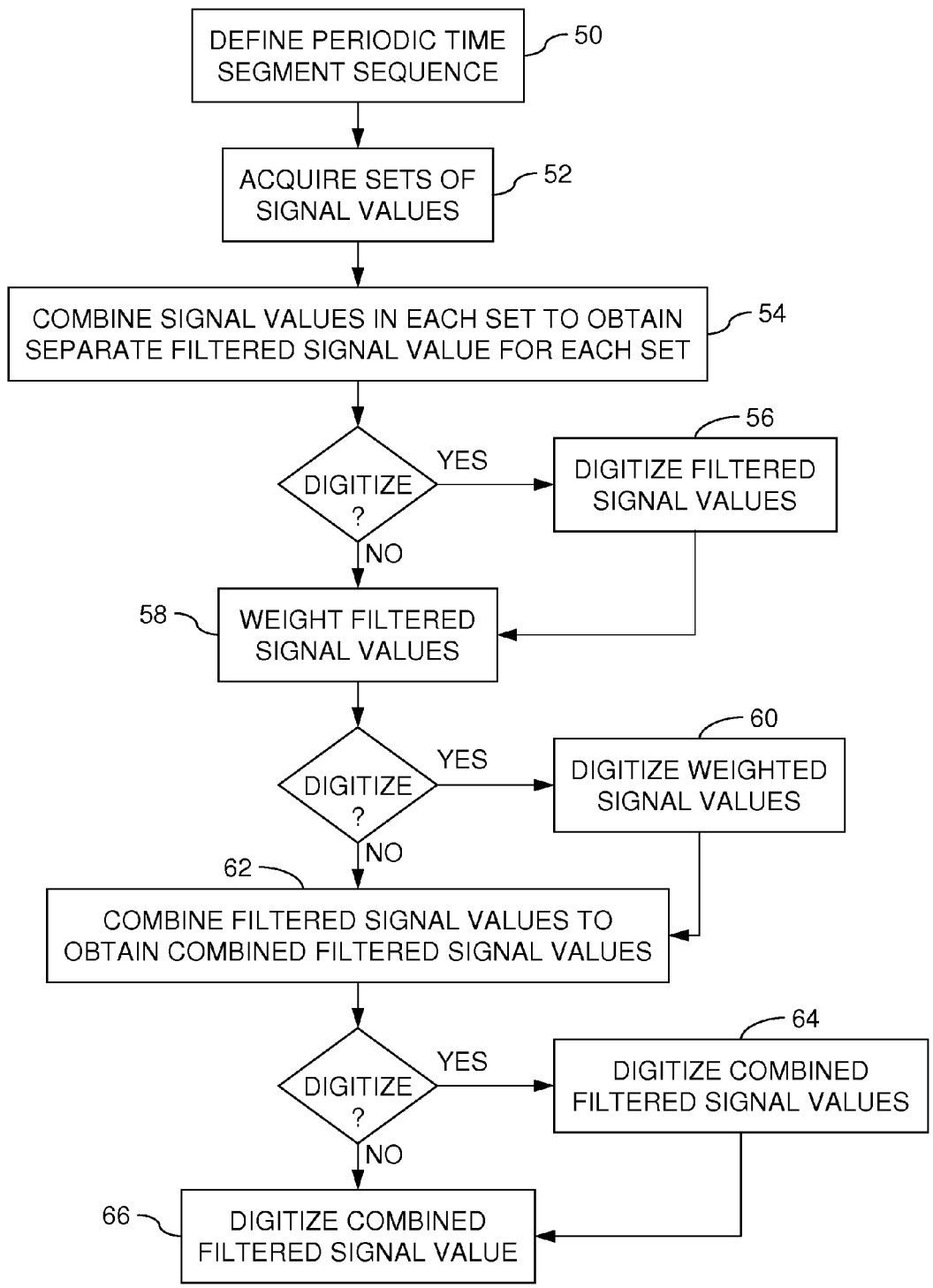
FIG. 6 is a flow chart showing one embodiment of the present invention method for extracting filtered signal values from an input signal.

FIG. 6 is a flow chart representing steps of various embodiments of aspects of the present invention. Although the steps represented in this Figure are presented in a specific order, the technology presented herein can be performed in any variation of this order. Furthermore, additional steps may be executed between the steps illustrated in this Figure. Although many of the following described enhancements are equally applicable to TSIS and TSIC, for simplicity the descriptions will use only the "accumulated value" terminology of TSIC. The TSIS terminology "sampled value" may be directly substituted for "accumulated value" in those descriptions to apply them to the TSIS approach.

FIG. 6 is a flow chart representing steps of one embodiment method for extracting filtered signal values from an input signal. A periodic time segment sequence having a plurality of ordered time segments is defined 50 by a timing system. Defining 50 the periodic time segment sequence includes selecting the number and sequence of the ordered time segments.

In one embodiment, the plurality of ordered time segments is a plurality of substantially non-overlapping ordered time segments. In one embodiment, the duration of each time segment is substantially the same as the duration of each other time segment of the periodic time segment sequence. In another embodiment, the duration of at least one of the time segments is not equal to the duration of the other time segments of the periodic time segment sequence.

Multiple sets of signal values are acquired 52 from the input signal by a capturing block. Each signal value of a set is acquired 52 during a same ordered time segment. That is, the signal values of a set are acquired from a time segment which is located in the same placement in the periodic sequence. By way of illustration, a periodic time segment sequence A, B, C, D may be defined 50, where A, B, C, D are the ordered time segments. The periodic time segment sequence repeats multiple times, such as A, B, C, D, A, B, C, D, A, B, C, D, A, B, C, D, etc. A set is associated with each of the ordered time segments A, B, C, D. The set of signal values associated with ordered time segment A all are acquired 52 during the ordered time segment A, but possibly a different repetition of A. The same is true for the sets associated with ordered time segments B, C, D. Each set is acquired 52 over multiple repetitions of the periodic time segment sequence. Each set is acquired 50 during a different ordered time segment than each other set.

In one embodiment, the number of time segments during which signal values are acquired 52 averaged over multiple repetitions of the periodic time segment sequence is a non-integer number. In one embodiment, the number of time segments during which signal values are acquired 52 is variable over the multiple repetitions of the periodic time segment sequence. In one embodiment, the number of time segments during which signal values are acquired 52 dithers between two consecutive integer numbers over multiple repetitions of the periodic time segment sequence.

In one embodiment, each set of signal values is acquired 52 during consecutive repetitions of the periodic time segment sequence. In an alternate embodiment, each set of signal values is acquired 52 during nonconsecutive repetitions of the periodic time segment sequence.

In one embodiment, the sets of signal values are acquired 52 from the input signal by impulse sampling the input signal with an impulse sampling block. In an alternate embodiment, the sets of signal values are acquired 52 from the input signal by, for each signal value of each set of signal values, accumulating the input signal during the ordered time segment during which the signal value is acquired. Each signal value is then of an amount representative of the mathematical integral of the input signal during the ordered time segment over which the signal value is acquired.

For each set of at least two sets, signal values from the set are combined 54 by a signal value combining system to obtain a separate filtered signal value for each set. In the example above, signal values from set A are combined to form one separate filtered signal value for set A and the signal values from sets B, C, and D are combined separately to form three more filtered signal values for their respective sets.

In one embodiment, the filtered signal values are bandpass filtered signal values. In one embodiment, the filtered signal values together constitute a bandpass filtered representation of the input signal. In one embodiment, the filtered signal values constitute a complex baseband representation of a bandpass filtered representation of the input signal. In one embodiment, each filtered signal value forms a decimation filter and together the filtered signal values form a bandpass filter.

In one embodiment, the signal values from the set are combined 54 to achieve a low pass filter value for the set. In one embodiment, the low pass filter value for each set is digitized 56 by an analog to digital converter. In one embodiment, the signal values from the set are combined 54 by adding the signal values from the set to obtain a separate filtered signal value for each set.

In one embodiment, each set of signal values is combined 54 to obtain filtered signal values by accumulating the signal values of each set to obtain a separate filtered signal value for each set. An accumulation block accumulates the signal values of each set to obtain a separate filtered signal value for each set. Each filtered signal value is of an amount representative of the mathematical integral of the input signal during each ordered time segment over which the set of signal values is acquired 52. In another embodiment, signal values from a set are combined 54 to obtain a separate filtered signal value for each set by combining signal values from the set to obtain a separate and orthogonal filtered signal value for each set.

In one embodiment, the filtered signal values are combined 62 by the signal value combining system to obtain a combined filtered signal value. In the example above, the filtered signal values from sets A, B, C, and D may be combined in any manner to achieve a combined filtered signal value. For example the filtered signal values may be combined by adding or subtracting such as A+B+C+D or A+B−C−D or B+C−A−D or even A−C or B−D.

In one embodiment, the filtered signal values are weighted 58 by the signal value combing system prior to combining 62 the filtered signal values. These weighted and combined filtered signal values are a mixed filtered signal value.

In one embodiment, weighting 58 and combining 62 is accomplished by analog means. In another embodiment, the filtered signal values are digitized 56 and the filtered signal values are weighted 58 and combined 62 by digitally weighting 58 and digitally combining 62 the digitized filtered signal values. In one embodiment, the weighted filtered signal values are digitally combined 62 by digitally combining 62 the weighted filtered signal values to mix the input signal with a weighting signal.

In one embodiment, the filtered signal values are combined 66 by combining 62 at least two of the filtered signal values by analog means. The combined filtered signal values are digitized 64 by an analog to digital converter. The digitized combined filtered signal values are digitally weighted and digitally combined 66 by a digital signal value combining system.

In one embodiment at least two of the filtered signal values are combined 62 by creating at least one pair of combined filtered signal values. Each pair of combined filtered signal values is created by combining 62 a filtered signal value obtained from a set of signal values acquired during one ordered time segment and combining 62 another filtered signal value obtained from a set of signal values acquired during another ordered time segment. The ordered time segments during which the filtered signal values are acquired are separated by half of the number of ordered time segments in the time segment sequence.

In one embodiment, the input signal contains at least one modulated signal. The filtered signal values together are then representative of a passband containing a target modulated signal which contains at least one modulation signal. In one embodiment, the filtered signal values together constitute a complex baseband representation of the target modulated signal. In one embodiment, the periodic time segment sequence has a plurality of ordered time segments per period of the modulated signal. In one embodiment, the target modulated signal contains in-phase and quadrature modulation signals.

In one embodiment, multiple filtered signal values are weighted 58 and combined 62 to obtain values representative of at least one of the modulation signals of the target modulated signal. In one embodiment, the filtered signal values are weighted 58 by multiplying multiple filtered signal values by a soft local clock. The soft local clock may be any type of soft local clock such as a discrete time sine wave, a discrete time cosine wave, and a discrete time square wave.

In one embodiment, a local clock signal is developed which correlates in time to the target modulated signal. Each cycle of the local clock signal spans multiple ordered time segments, equal in number to the number of ordered time segments in the time segment sequence. In one embodiment, the local clock signal is a hardware local clock signal that controls the rate of acquiring the signal values.

In one embodiment, the sets of signal values are acquired 52 from the input signal by impulse sampling the input signal. The impulse sampling is synchronous with the target modulated signal.

The methods and systems disclosed herein accomplish the highest goal of SDR, to provide hardware which provides fully flexible reception and transmission, in any programmable format, of any modulated signal, and without compromising performance, to accomplish this flexibility.

The present invention does not require any synchronous relationship between any of four potentially different clocking domains. One domain is the input signal domain, the second domain is a sampling or signal acquisition domain, the third domain is a decimation domain, and the fourth domain is a signal processing or DSP domain.

The first domain is the input signal domain and includes the circuits or signals, if any, that are synchronous, or are intended to become or remain synchronous with a target modulated signal. The sampling or signal acquisition domain is a clock or timing domain where regular samples or value acquisitions occur, at a rate and for intervals controlled by a sampling or value acquisition clock or timing signal.

The decimation domain is characterized by circuits driven and responsive to a sequence clock timing circuit, wherein are defined two or more separately identified time segments, each being approximately constant in period or duration, and a regular sequence of these time segments, which counts sequentially through each of the time segments in a consistent order, and then repeats the sequence in order, with the first time segment immediately following the last time segment of the sequence. For example, for a given case where there are four time segments, they might be named A, B, C, and D, in which case the sequence of time segments might be A,B,C, D,A,B,C,D,A,B,C,D,A,B,C,D . . . . Any input signal sample or acquisition value acquired during any ordered time segment of the sequence is combined with any other signal sample or acquisition value acquired during the same ordered time segment. Whenever such values acquired and so combined are from separate repetitions of the same time segment, decimation thereby occurs. This combination and decimation happens throughout the duration of any one RF2Dout cycle, for however many repetitions of the time segment sequence occur during each RF2Dout cycle. Since these clocks are not necessarily synchronous, this can result in variable counts of time segment sequences for any given RF2Dout cycle. This tends to result in a time based quantization error. However, this error becomes less significant, as the average number of time segment sequence repetitions per RF2Dout cycle increases.

The fourth domain, is the processing domain, and includes the circuits of a Digital Signal Processing block, (DSP block), wherein programmable sequential steps are executed, and where thereby data delivered to the DSP from the A to D block, can be operated upon mathematically, in any means desirable and programmable, to filter or extract various signal values and signal streams from the stream of signal data delivered to the DSP from the A to D.

Asynchronicity between the first and second clock domains has been elaborately discussed, asynchronicity between the third and fourth domains is assumed, as this is typical for most DSP systems, as long as the DSP processes data fast enough, synchronicity is not usually a factor. Asynchronicity between the second and third domains is potentially problematic, but as long as there are more than the minimum of four time segments in the periodic time segment sequence, the higher the number of time segments in the periodic time segment sequence, the less significant an error in values accumulated during any one periodic decimation time segment would be. An asynchronicity between the sampling and decimation clock domains could only generate an error between the two domains which is less than or equal to twice the largest value accumulated during a single time segment. If there are many time segments, this will become increasingly small.

The point to all of this is that asynchronous versions of these blocks begin to be quite effective once the number of time segments in the periodic time segment sequence is increased to a point where the effective errors generated by the asynchronicity are not as significant. And, similarly, once the number of samples or acquisition values is increased above the one sample per decimation time segment level, this also tends to increasingly reduce the significance of errors due to asynchronicity between these two clock domains. Because of these effects, higher over-sampling ratios can enable the use of systems with asynchronous clock domains without much of loss in performance, and, in fact, often higher performance may result due to the higher resolution of the subsequent post conversion mixing which occurs in the DSP or other digital signal processing blocks which follow the A to D.

There is one other partial synchronicity case worthy of discussion, and that is the case where the input signal is undersampled. Undersampled here, means that in order to make it easier to accomplish a signal acquisition for a given higher frequency input signal, a sampling or signal acquisition clock frequency can be used which is actually lower than the frequency of the input signal, a sub harmonic. This can be done for most RF modulated signals, because the bandwidth of the signal is substantially narrower than the center frequency of the modulated signal. Because of this, the effective Nyquist sample rate is based on the bandwidth of the modulated signal, not on its center frequency. So, while in most circumstances, it is likely to result in a higher noise level in the acquired signal, a modulated signal can be undersampled and still avoid any aliasing from the desired signal. However this does not help in avoiding aliasing due to unintended interfering signals from harmonically related bands. In order to avoid this interference, it would require external RF filtering to exclude the bands which any particular undersampling scheme might cause to become potential interferers. None the less, this remains a valuable implementation of the concepts herein.

The foregoing description is only illustrative of the invention. Various alternatives and modifications can be devised by those skilled in the art without departing from the invention.

Accordingly, the present invention embraces all such alternatives, modifications, and variances that fall within the scope of the appended claims.

What is claimed is:

1. A method for extracting filtered signal values from an input signal, the method comprising:
    defining a periodic time segment sequence having a plurality of ordered time segments;
    acquiring multiple sets of signal values from the input signal, each signal value of a set acquired during a same ordered time segment, each set acquired over multiple repetitions of the periodic time segment sequence, each set acquired during a different ordered time segment than each other set; and
    for each set of at least two sets, combining signal values from the set to obtain a separate filtered signal value for each set.

2. The method of claim 1 further including combining the filtered signal values to obtain a combined filtered signal value.

3. The method of claim 2 further including weighting the filtered signal values prior to combining the filtered signal values and wherein the combined filtered signal values are a mixed filtered signal value.

4. The method of claim 3 wherein weighting and combining the filtered signal values includes weighting and combining the filtered signal values by analog means.

5. The method of claim 3 further including digitizing the filtered signal values and wherein weighting and combining the filtered signal values includes digitally weighting and digitally combining the digitized filtered signal values.

6. The method of claim 5 wherein digitally combining the weighted filtered signal values includes digitally combining the weighted filtered signal values to mix the input signal with a weighting signal.

7. The method of claim 2:
    wherein combining the filtered signal values to obtain a combined filtered signal value includes combining at least two of the filtered signal values by analog means and
    further including digitizing the combined filtered signal values and digitally weighting and digitally combining the digitized combined filtered signal values.

8. The method of claim 7 wherein combining at least two of the filtered signal values includes creating at least one pair of combined filtered signal values, each pair of combined filtered signal values created by combining a first filtered signal value obtained from a set of signal values acquired during one ordered time segment and combining a second filtered signal value obtained from a set of signal values acquired during another ordered time segment, wherein the ordered time segments during which the first and second filtered signal values are acquired are separated by half of the number of ordered time segments in the time segment sequence.

9. The method of claim 1 wherein the duration of each time segment is substantially the same as the duration of each other time segment of the periodic time segment sequence.

10. The method of claim 1 wherein the duration of at least one of the time segments is not equal to the duration of the other time segments of the periodic time segment sequence.

11. The method of claim 1 wherein a number of time segments during which signal values are acquired averaged over the multiple repetitions of the periodic time segment sequence is a non-integer number.

12. The method of claim 11 wherein the number of time segments during which signal values are acquired is variable over the multiple repetitions of the periodic time segment sequence.

13. The method of claim 12 wherein the number of time segments during which signal values are acquired dithers between two consecutive integer numbers over the multiple repetitions of the periodic time segment sequence.

14. The method of claim 1 wherein each set of signal values is acquired during consecutive repetitions of the periodic time segment sequence.

15. The method of claim 1 wherein each set of signal values is acquired during nonconsecutive repetitions of the periodic time segment sequence.

16. The method of claim 1 wherein combining the signal values from the set to obtain a separate filtered signal value for each set includes combining the signal values from the set to achieve a low pass filter value for the set.

17. The method of claim 16 wherein combining the signal values from the set to obtain a separate filtered signal value for each set includes adding the signal values from the set to obtain a separate filtered signal value for each set.

18. The method of claim 16 further including digitizing the low pass filter value for each set.

19. The method of claim 1 wherein acquiring the sets of signal values from the input signal includes impulse sampling the input signal.

20. The method of claim 1 wherein:
    acquiring the sets of signal values from the input signal includes, for each signal value of each set of signal values, accumulating the input signal during the ordered time segment during which the signal value is acquired and
    each signal value is of an amount representative of the mathematical integral of the input signal during the ordered time segment over which the signal value is acquired.

21. The method of claim 20 wherein:
    combining each set of signal values to obtain the filtered signal values includes accumulating the signal values of each set to obtain a separate filtered signal value for each set and
    each filtered signal value is of an amount representative of the mathematical integral of the input signal during each ordered time segment over which the set of signal values is acquired.

22. The method of claim 1 wherein combining signal values from the set to obtain a separate filtered signal value for each set includes combining signal values from the set to obtain a separate and orthogonal filtered signal value for each set.

23. The method of claim 1 wherein combining each set of signal values to obtain the filtered signal values includes accumulating each set of signal values to obtain the filtered signal values.

24. The method of claim 1 wherein the plurality of ordered time segments is a plurality of substantially non-overlapping ordered time segments.

25. The method of claim 1 wherein the filtered signal values are bandpass filtered signal values.

26. The method of claim 1 wherein the filtered signal values together constitute a bandpass filtered representation of the input signal.

27. The method of claim 1 wherein the filtered signal values constitute a complex baseband representation of a bandpass filtered representation of the input signal.

28. The method of claim 1 wherein each filtered signal value forms a decimation filter and together the filtered signal values form a bandpass filter.

29. The method of claim 1 wherein:
the input signal contains at least one modulated signal and
the filtered signal values together are representative of a passband containing a target modulated signal which contains at least one modulation signal.

30. The method of claim 29 further including weighting and combining multiple filtered signal values to obtain values representative of at least one of the modulation signals of the target modulated signal.

31. The method of claim 30 wherein weighting the filtered signal values includes multiplying multiple filtered signal values by a soft local clock.

32. The method of claim 31 wherein the soft local clock is selected from the group consisting of a discrete time sine wave, a discrete time cosine wave, and a discrete time square wave.

33. The method of claim 29 wherein the target modulated signal contains in-phase and quadrature modulation signals.

34. The method of claim 29 further including developing a local clock signal which correlates in time to the target modulated signal and wherein each cycle of the local clock signal spans multiple ordered time segments, equal in number to the number of ordered time segments in the time segment sequence.

35. The method of claim 34 wherein the local clock signal is a hardware local clock signal that controls the rate of acquiring the signal values.

36. The method of claim 29 wherein acquiring the sets of signal values from the input signal includes impulse sampling the input signal and wherein the impulse sampling is synchronous with the target modulated signal.

37. The method of claim 29 wherein the filtered signal values together constitute a complex baseband representation of the target modulated signal.

38. A system for extracting filtered signal values from an input signal, the system comprising:
a timing system configured to define a periodic time segment sequence having a plurality of ordered time segments;
a capturing block configured to acquire multiple sets of signal values from the input signal, each signal value of a set acquired during a same ordered time segment, each set acquired over multiple repetitions of the periodic time segment sequence, each set acquired during a different ordered time segment than each other set; and
a signal value combining system configured to, for each set of at least two sets, combine signal values from the set to obtain a separate filtered signal value for each set.

39. The system of claim 38 wherein the signal value combining system is further configured to combine the filtered signal values to obtain a combined filtered signal value.

40. The system of claim 39 wherein the signal value combining system is further configured to weight the filtered signal values prior to combining the filtered signal values and wherein the combined filtered signal values are a mixed filtered signal value.

41. The system of claim 40 wherein weighting and combining the filtered signal values includes weighting and combining the filtered signal values by analog means.

42. The system of claim 40 wherein the signal value combing system further includes:
an analog to digital converter configured to digitize the filtered signal values and
a digital signal value combining system configured to digitally weight and digitally combine the digitized filtered signal values.

43. The system of claim 42 wherein digitally combining the weighted filtered signal values includes digitally combining the weighted filtered signal values to mix the input signal with a weighting signal.

44. The system of claim 39:
wherein combining the filtered signal values to obtain a combined filtered signal value includes combining at least two of the filtered signal values by analog means and
wherein the signal value combing system further includes an analog to digital converter configured to digitize the combined filtered signal values and a digital signal value combining system configured to digitally weight and digitally combine the digitized combined filtered signal values.

45. The system of claim 44 wherein combining at least two of the filtered signal values includes creating at least one pair of combined filtered signal values, each pair of combined filtered signal values created by combining a first filtered signal value obtained from a set of signal values acquired during one ordered time segment and combining a second filtered signal value obtained from a set of signal values acquired during another ordered time segment, wherein the ordered time segments during which the first and second filtered signal values are acquired are separated by half of the number of ordered time segments in the time segment sequence.

46. The system of claim 38 wherein the duration of each time segment is substantially the same as the duration of each other time segment of the periodic time segment sequence.

47. The system of claim 38 wherein the duration of at least one of the time segments is not equal to the duration of the other time segments of the periodic time segment sequence.

48. The system of claim 38 wherein a number of time segments during which signal values are acquired averaged over the multiple repetitions of the periodic time segment sequence is a non-integer number.

49. The system of claim 48 wherein the number of time segments during which signal values are acquired is variable over the multiple repetitions of the periodic time segment sequence.

50. The system of claim 49 wherein the number of time segments during which signal values are acquired dithers between two consecutive integer numbers over the multiple repetitions of the periodic time segment sequence.

51. The system of claim 38 wherein each set of signal values is acquired during consecutive repetitions of the periodic time segment sequence.

52. The system of claim 38 wherein each set of signal values is acquired during nonconsecutive repetitions of the periodic time segment sequence.

53. The system of claim 38 wherein combining the signal values from the set to obtain a separate filtered signal value for each set includes combining the signal values from the set to achieve a low pass filter value for the set.

54. The system of claim 53 wherein combining the signal values from the set to obtain a separate filtered signal value for each set includes adding the signal values from the set to obtain a separate filtered signal value for each set.

55. The system of claim 52 further including an analog to digital converter configured to digitize the low pass filter value for each set.

56. The system of claim 38 wherein the capturing block further includes an impulse sampling block configured to impulse sample the input signal and wherein acquiring the sets of signal values from the input signal includes impulse sampling the input signal.

57. The system of claim 38 wherein:
the capturing block further includes an accumulation block configured to accumulate the input signal;
acquiring the sets of signal values from the input signal includes, for each signal value of each set of signal values, accumulating the input signal during the ordered time segment during which the signal value is acquired and
each signal value is of an amount representative of the mathematical integral of the input signal during the ordered time segment over which the signal value is acquired.

58. The system of claim 57 wherein:
combining each set of signal values to obtain the filtered signal values includes accumulating the signal values of each set to obtain a separate filtered signal value for each set and
each filtered signal value is of an amount representative of the mathematical integral of the input signal during each ordered time segment over which the set of signal values is acquired.

59. The system of claim 38 wherein combining signal values from the set to obtain a separate filtered signal value for each set includes combining signal values from the set to obtain a separate and orthogonal filtered signal value for each set.

60. The system of claim 38 wherein combining each set of signal values to obtain the filtered signal values includes accumulating each set of signal values to obtain the filtered signal values.

61. The system of claim 38 wherein the plurality of ordered time segments is a plurality of substantially non-overlapping ordered time segments.

62. The system of claim 38 wherein the filtered signal values are bandpass filtered signal values.

63. The system of claim 38 wherein the filtered signal values together constitute a bandpass filtered representation of the input signal.

64. The system of claim 38 wherein the filtered signal values constitute a complex baseband representation of a bandpass filtered representation of the input signal.

65. The system of claim 38 wherein each filtered signal value forms a decimation filter and together the filtered signal values form a bandpass filter.

66. The system of claim 38 wherein:
the input signal contains at least one modulated signal and
the filtered signal values together are representative of a passband containing a target modulated signal which contains at least one modulation signal.

67. The system of claim 66 wherein the signal value combining system is further configured to weight and combine multiple filtered signal values to obtain values representative of at least one of the modulation signals of the target modulated signal.

68. The system of claim 67 further including a soft local clock and wherein the signal value combining system is further configured to weight the filtered signal values by multiplying multiple filtered signal values by the soft local clock.

69. The system of claim 68 wherein the soft local clock is selected from the group consisting of a discrete time sine wave, a discrete time cosine wave, and a discrete time square wave.

70. The system of claim 66 wherein the target modulated signal contains in-phase and quadrature modulation signals.

71. The system of claim 66 wherein the timing system is further configured to develop a local clock signal which correlates in time to the target modulated signal and wherein each cycle of the local clock signal spans multiple ordered time segments, equal in number to the number of ordered time segments in the time segment sequence.

72. The system of claim 71 wherein the timing system includes a hardware local clock signal that controls the rate of acquiring the signal values and wherein the local clock signal is the hardware local clock signal.

73. The system of claim 66 wherein the capturing block further includes an impulse sampling block configured to impulse sample the input signal and wherein acquiring the sets of signal values from the input signal includes impulse sampling the input signal and wherein the impulse sampling is synchronous with the target modulated signal.

74. The system of claim 66 wherein the filtered signal values together constitute a complex baseband representation of the target modulated signal.

* * * * *